United States Patent
Trezza et al.

(10) Patent No.: US 8,399,820 B2
(45) Date of Patent: Mar. 19, 2013

(54) MULTICOLOR DETECTORS AND APPLICATIONS THEREOF

(75) Inventors: John Trezza, Manalapan, NJ (US); Martin Ettenberg, Princeton, NJ (US)

(73) Assignee: Sensors Unlimited, Inc., Princeton, NJ (US)

( * ) Notice: Subject to any disclaimer, the term of this patent is extended or adjusted under 35 U.S.C. 154(b) by 75 days.

(21) Appl. No.: 12/489,871

(22) Filed: Jun. 23, 2009

(65) Prior Publication Data

US 2010/0320365 A1  Dec. 23, 2010

(51) Int. Cl.
- *H01L 31/00* (2006.01)
- *H01L 27/00* (2006.01)
- *H01L 29/66* (2006.01)
- *H01J 40/14* (2006.01)
- *H04N 9/04* (2006.01)

(52) U.S. Cl. ............... 250/214.1; 250/208.1; 250/214 R; 257/343; 257/440

(58) Field of Classification Search .............. 250/214.1, 250/208.1, 216, 214 R, 551; 257/93, 102, 257/103, 226, 227, 334, 343, 440, 444, 446; 348/269–280

See application file for complete search history.

(56) References Cited

U.S. PATENT DOCUMENTS

| | | | |
|---|---|---|---|
| 4,514,755 A | | 4/1985 | Tabei |
| 5,373,182 A | * | 12/1994 | Norton .......................... 257/440 |
| 5,479,032 A | | 12/1995 | Forrest et al. |
| 7,352,043 B2 | | 4/2008 | Gidon |
| 7,629,582 B2 | * | 12/2009 | Hoffman et al. ......... 250/339.01 |
| 2004/0195509 A1 | * | 10/2004 | Sundaram et al. ......... 250/338.1 |
| 2006/0043438 A1 | | 3/2006 | Holm et al. |
| 2006/0124831 A1 | * | 6/2006 | Schimert et al. .......... 250/214 R |
| 2009/0121307 A1 | | 5/2009 | Tennant |

FOREIGN PATENT DOCUMENTS

FR  2849273 A1  6/2004

OTHER PUBLICATIONS

European Search Report mailed on Sep. 15, 2010 in European Application No. 10167067.7.

* cited by examiner

*Primary Examiner* — Georgia Y Epps
*Assistant Examiner* — Don Williams
(74) *Attorney, Agent, or Firm* — J. Clinton Wimbish; Smith Moore Leatherwood LLP

(57) ABSTRACT

In one aspect, the present invention provides photodetectors and components thereof having multi-spectral sensing capabilities. In some embodiments, photodetectors of the present invention provide a first photosensitive element comprising at least one accessway extending through the element and an electrical connection at least partially disposed in the accessway, the electrical connection accessible for receiving a second photosensitive element.

21 Claims, 15 Drawing Sheets

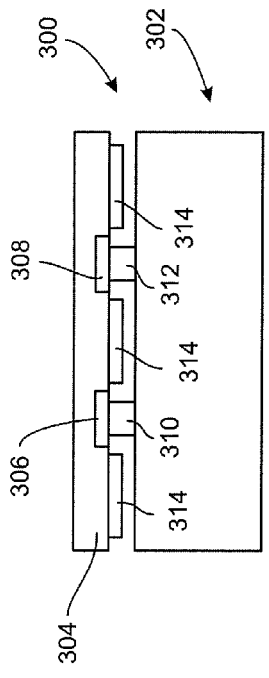
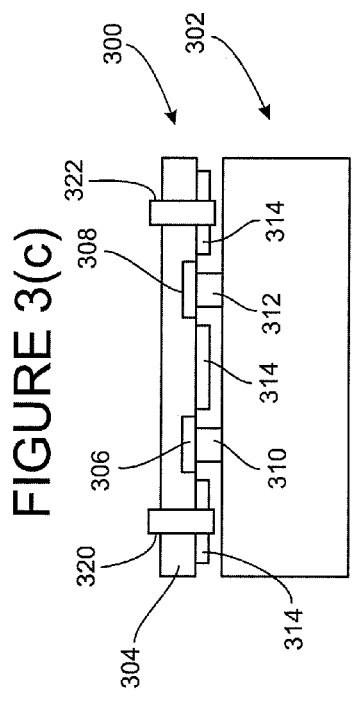
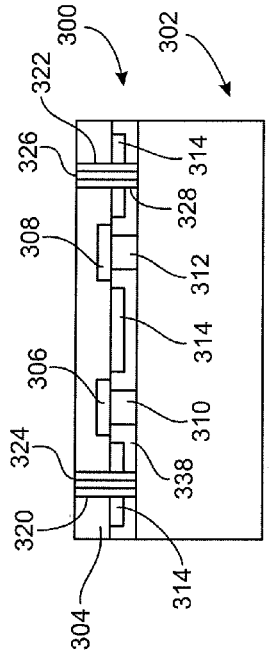
FIGURE 3(c)  FIGURE 3(d)  FIGURE 3(e)
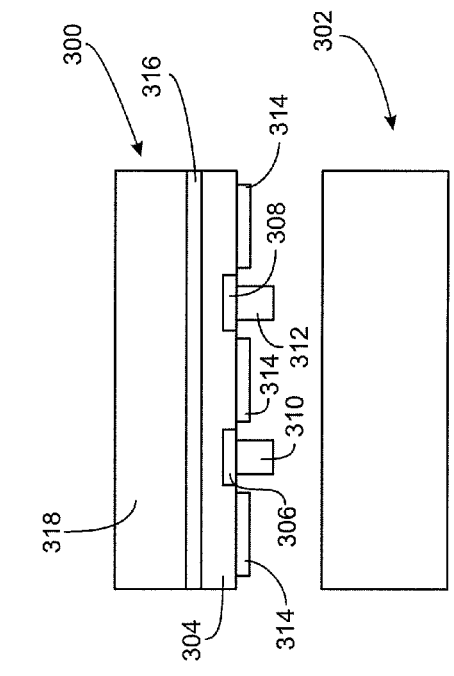
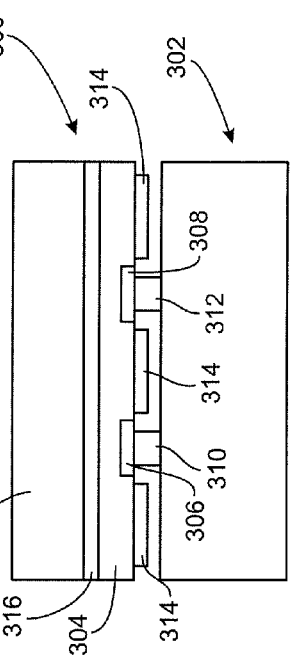
FIGURE 3(a)  FIGURE 3(b)

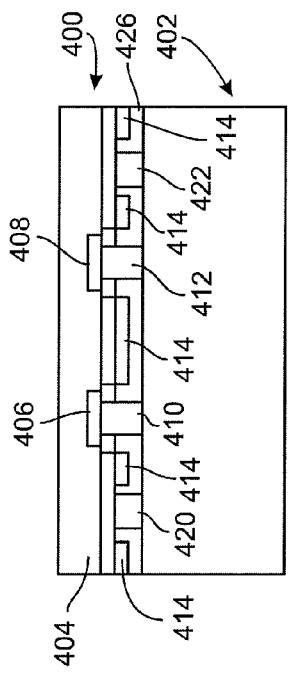
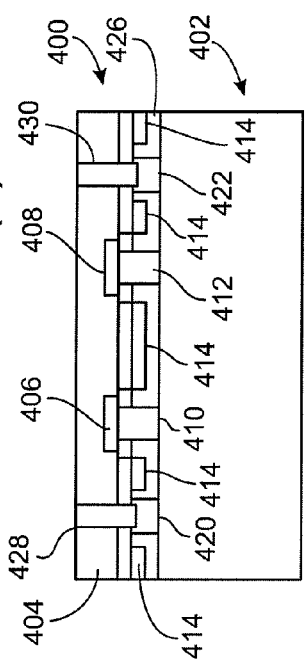
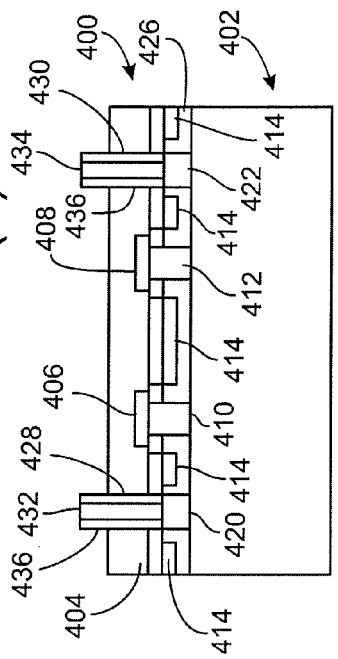
FIGURE 4(c)
FIGURE 4(d)
FIGURE 4(e)
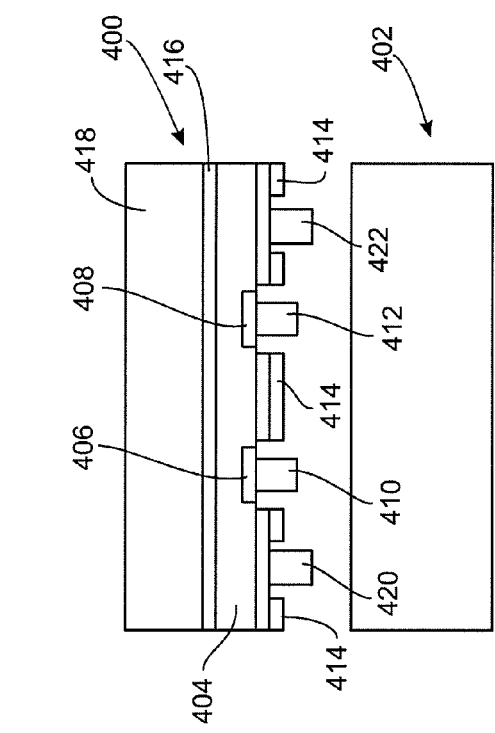
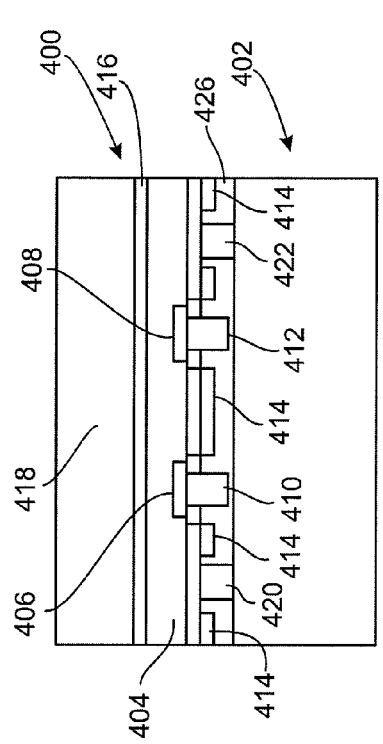
FIGURE 4(a)
FIGURE 4(b)

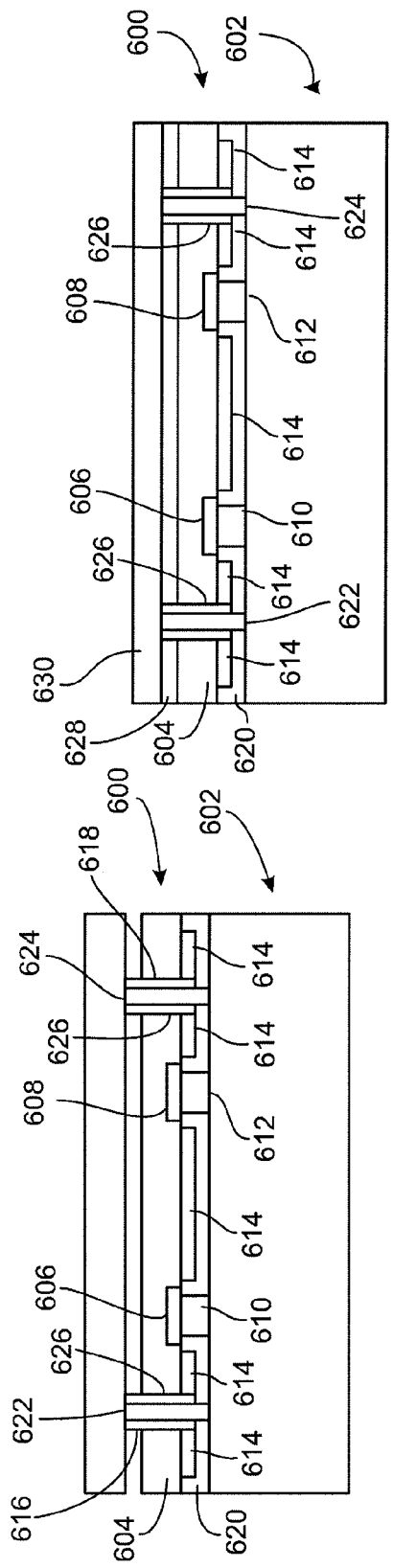
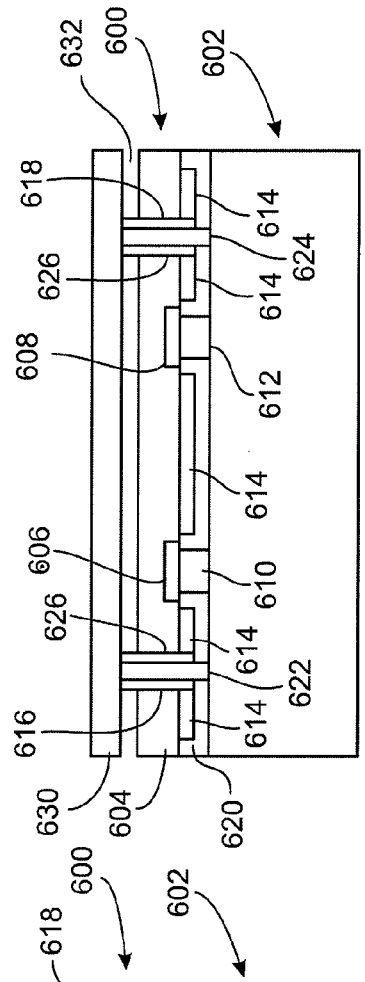
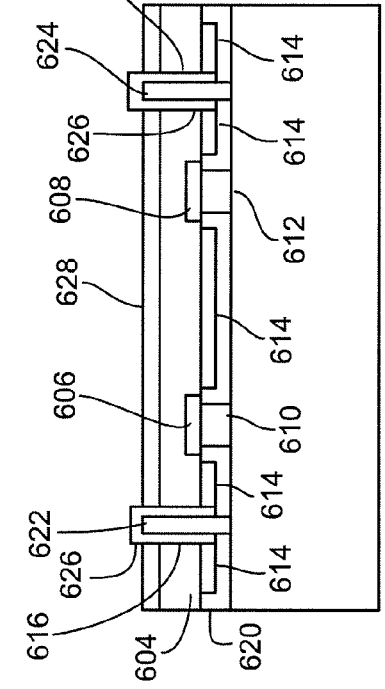
FIGURE 6(a)
FIGURE 6(b)
FIGURE 6(c)
FIGURE 6(d)

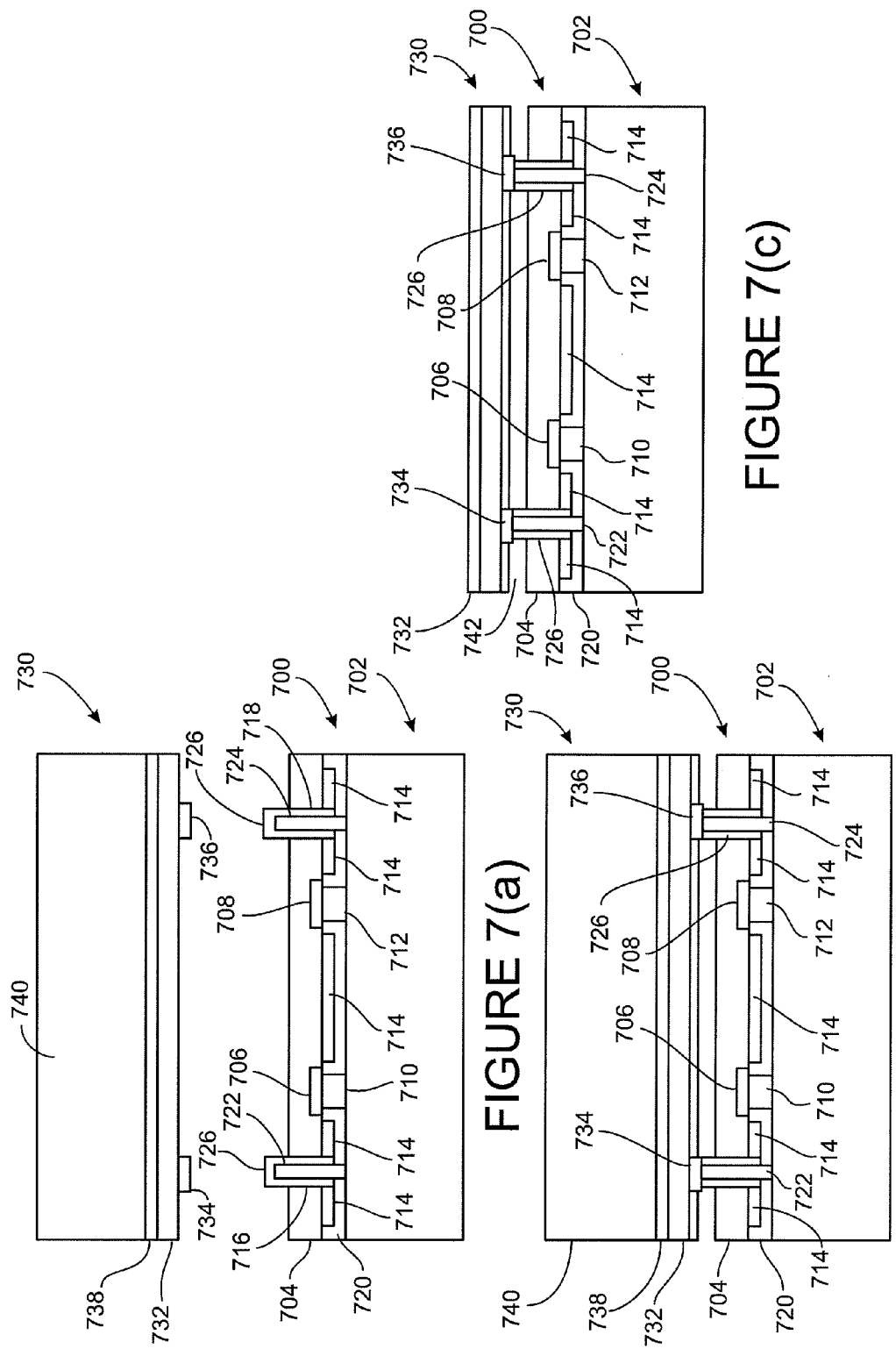

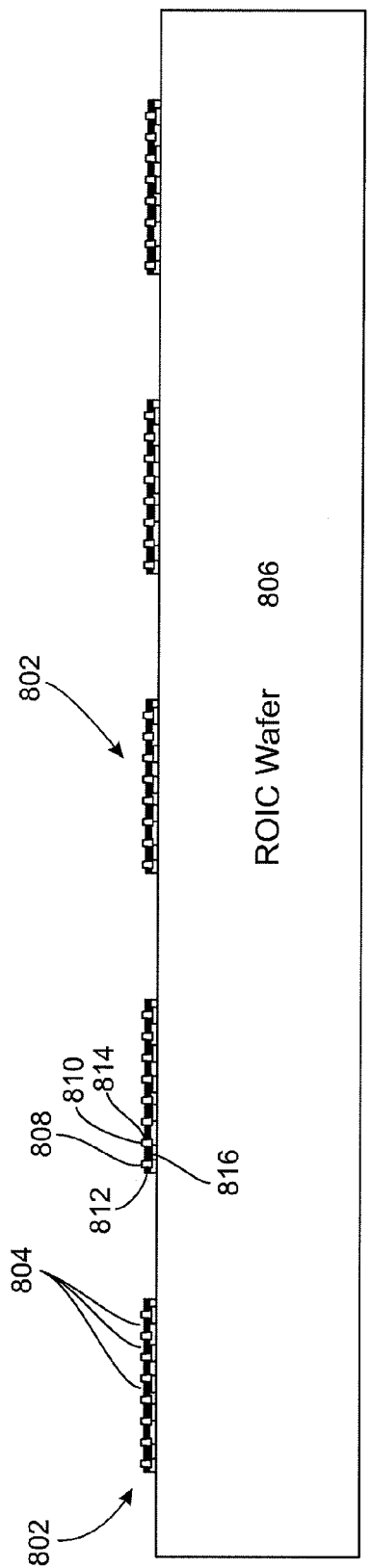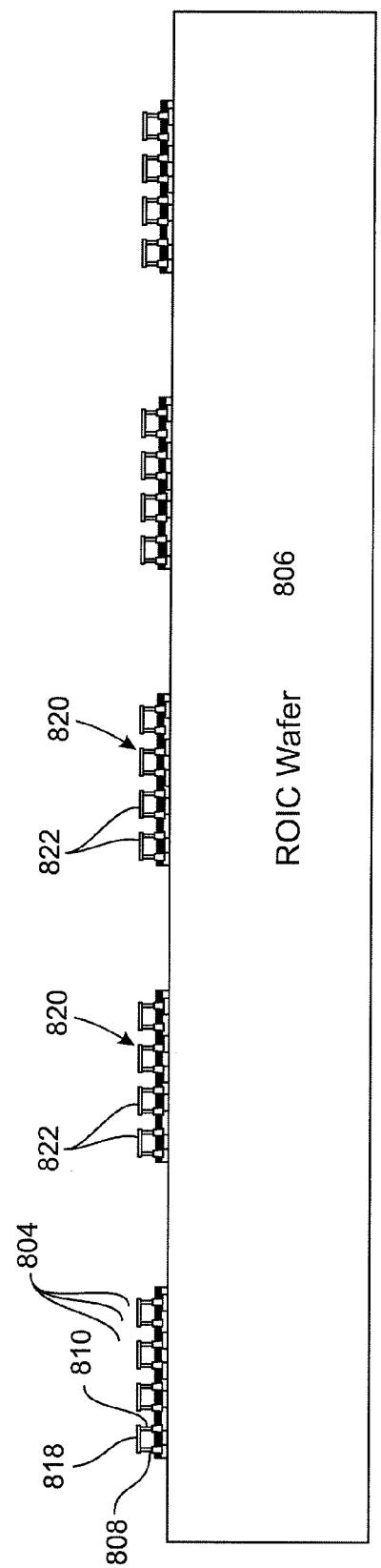

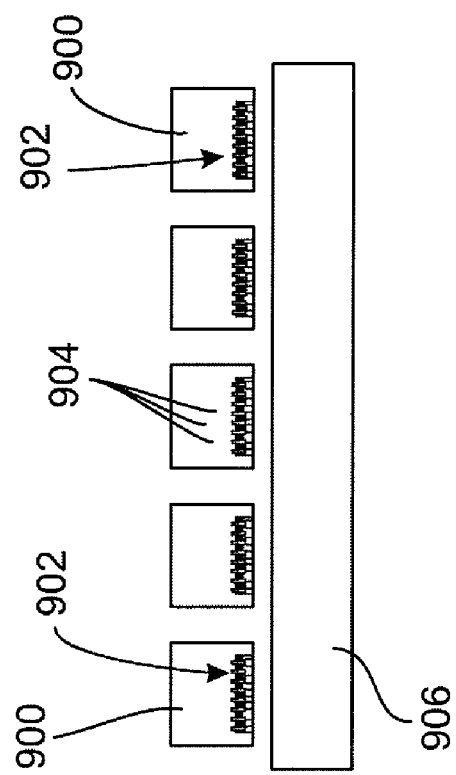
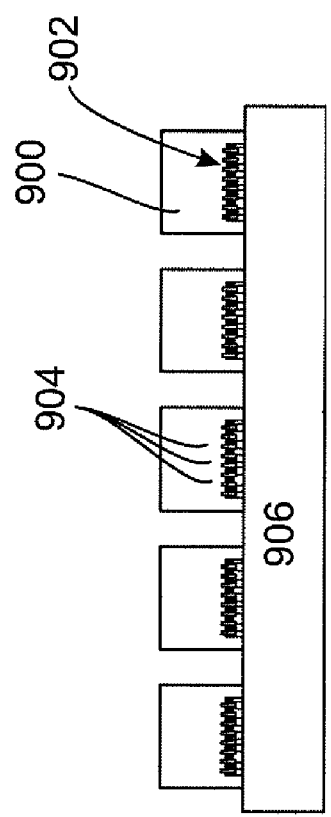
FIGURE 9(a)
FIGURE 9(b)

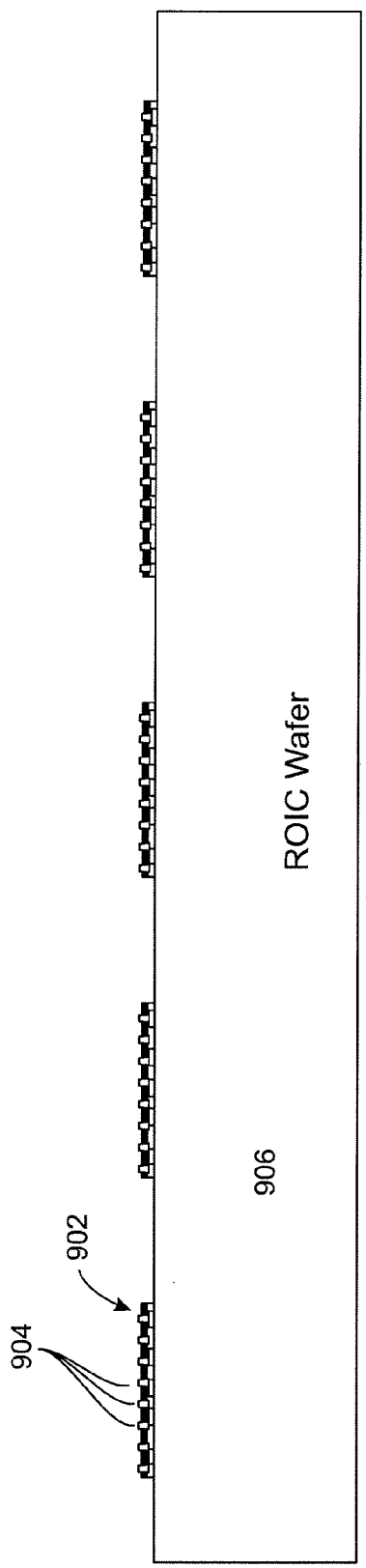
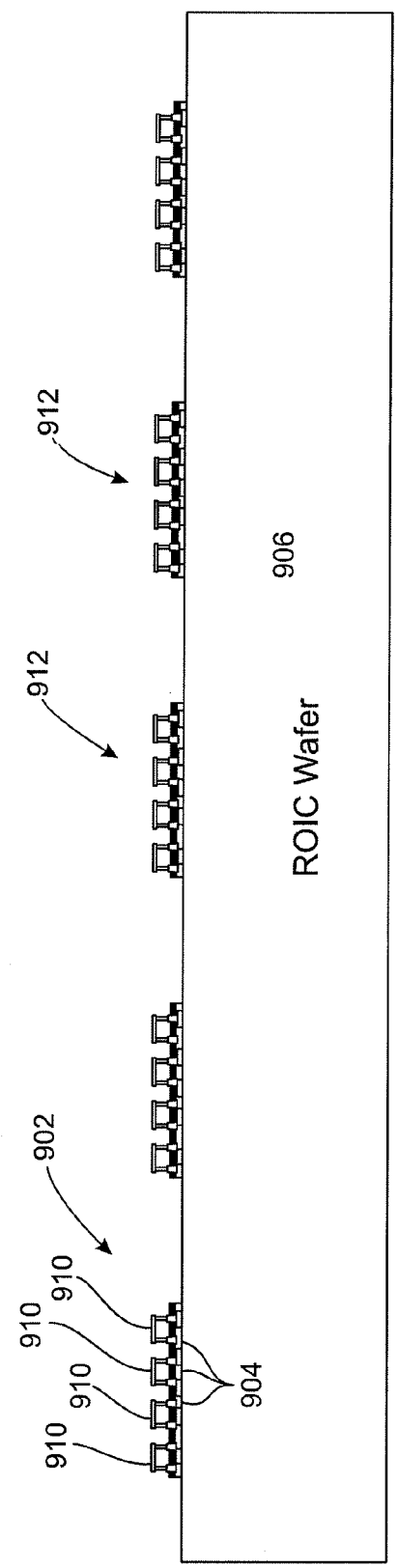
FIGURE 9(c)
FIGURE 9(d)

MULTICOLOR DETECTORS AND APPLICATIONS THEREOF

FIELD OF THE INVENTION

The present invention relates to photodetectors and, in particular, to photodetectors responsive to radiation of more than one wavelength band.

BACKGROUND OF THE INVENTION

Photonic sensing apparatus can derive significant benefits from the ability to provide a response over more than a single range of wavelengths. In recognition of this, several constructions have been proposed to provide photonic sensing apparatus multi-spectral functionality.

In one construction, photosensitive layers having divergent radiation absorption profiles are presented in a stacked configuration to provide multi-spectral functionality, wherein photosensitive layers absorbing shorter wavelengths of radiation are positioned over photosensitive layers absorbing longer wavelengths of radiation to avoid potential attenuation and interference of short wavelength radiation by long wavelength photosensitive materials. Long wavelength photosensitive materials, for example, can absorb and/or scatter radiation of shorter wavelengths, thereby providing significant attenuation or even precluding such radiation from reaching a short wavelength photosensitive layer.

Restriction to short wavelength photosensitive layers disposed over long wavelength photosensitive layers in a stacked photodetector configuration presents several disadvantages. One disadvantage is degradation of long wavelength photosensitive materials and structures resulting from the processing required for the subsequent deposition of one or more short wavelength photosensitive materials.

Another disadvantage is the inability to thermally isolate long wavelength photosensitive layers in prior stacked configurations. Materials absorbing long wavelength electromagnetic radiation are often sensitive to thermal fluctuations and can suffer significant signal to noise (S/N) degradation resulting from dark currents in response to such thermal fluctuations. As a result, long wavelength photosensitive layers often require thermal isolation in order to provide the desired response.

As an alternative to photosensitive layers presented in a stacked configuration, photodetector constructions based on a plurality focal plane arrays have been proposed. In such constructions, each focal plane array is sensitive to radiation of a different spectral region. Optical assemblies are used to direct and distribute light received by the detector to the plurality of focal plane arrays. The various complexities of the optical assemblies used in directing the received light, nevertheless, are a significant disadvantage of multiple focal plane constructions.

A similar disadvantage is encountered in the use of segmented focal plane arrays wherein each segment of the array is sensitive to electromagnetic radiation of a different spectral region. As with multiple focal plane array constructions, use of segmented focal plane arrays usually requires complex optical assemblies to ensure the correct distribution of received light over the segmented array.

SUMMARY

In one aspect, the present invention provides photodetectors and components thereof having multi-spectral sensing capabilities. In some embodiments, photodetectors of the present invention can overcome disadvantages associated with prior detectors discussed herein.

The present invention, in some embodiments, provides a photodetector comprising a first photosensitive element coupled to a read-out integrated circuit, the first photosensitive element having an architecture operable for receiving a second photosensitive element and electrically connecting the second photosensitive element to the read-out integrated circuit. In some embodiments, for example, the first photosensitive element coupled to the read-out integrated circuit comprises an architecture facilitating the construction or processing of a second photosensitive element over the first photosensitive element resulting in a stacked configuration. In some embodiments, for example, the architecture of the first photosensitive element coupled to the read-out integrated circuit permits the construction or deposition of delicate long wavelength photosensitive structures over the first photosensitive element in the production of a photodetector having multi-spectral sensing capabilities.

In one embodiment, the present invention provides a photodetector comprising a first photosensitive element comprising one or more electrical contacts for coupling to a read-out integrated circuit and at least one accessway extending through the element and an electrical connection at least partially disposed in the accessway, the electrical connection accessible for receiving a second photosensitive element. As provided herein, the accessible electrical connection, in some embodiments, permits electrical communication of a second photosensitive element with the read-out integrated circuit, the second photosensitive element being deposited, constructed or hybridized over the first photosensitive element in a stacked configuration. In some embodiments, the first photosensitive element comprises a plurality of accessways, each accessway having an electrical connection at least partially disposed therein and accessible for receiving a second photosensitive element.

Moreover, in some embodiments, the second photosensitive element of a photodetector of the present invention comprises an accessway extending through the element and an electrical connection at least partially disposed in the accessway, the electrical connection accessible for receiving a third photosensitive element. The electrical connection of the second photosensitive element, in some embodiments, facilitates electrical communication of a third photosensitive element with the read-out integrated circuit, the third photosensitive element being deposited, constructed or hybridized over the second photosensitive element in a stacked configuration. In some embodiments, the second photosensitive element comprises a plurality of accessways, each accessway having an electrical connection at least partially disposed therein and accessible for receiving a third photosensitive element.

In another embodiment, the present invention provides one or more arrays of photodetectors coupled to a read-out integrated circuit wafer, wherein at least one of the photodetectors comprises a first photosensitive element electrically connected to the read-out integrated circuit wafer, the first photosensitive element having an accessway extending through the element and an electrical connection at least partially disposed in the accessway for receiving a second photosensitive element.

The photosensitive elements of photodetectors of the present invention can have any desired absorption spectra. In some embodiments, the electromagnetic radiation absorption spectra of the photosensitive elements do not overlap. In one embodiment, for example, the absorption spectra of the first and second photosensitive elements do not overlap. In other embodiments, the electromagnetic radiation absorption spectra of photosensitive elements partially overlap.

In some embodiments, the second photosensitive element absorbs radiation of a longer wavelength than the first photosensitive element. The second photosensitive element, in some embodiments, for example, absorbs electromagnetic radiation having a wavelength ranging from about 3 µm to about 5 µm, corresponding to mid-wavelength infrared (MWIR) radiation while the first photosensitive element absorbs electromagnetic radiation having a wavelength ranging from about 0.8 µm to about 2.8 µm corresponding to visible and short-wavelength infrared radiation (SWIR). In another embodiment, the second photosensitive element absorbs electromagnetic radiation having a wavelength ranging from about 8 µm to about 15 µm, corresponding to long-wavelength infrared (LWIR) radiation while the first photosensitive element absorbs SWIR or MWIR. In some embodiments, the second photosensitive element absorbs infrared radiation while the first photosensitive element absorbs visible radiation. In another embodiment, the second photosensitive element absorbs visible radiation while the first photosensitive element absorbs ultraviolet radiation. Alternatively, in some embodiments, the first photosensitive element absorbs radiation of a longer wavelength than the second photosensitive element.

A photosensitive element of a photodetector of the present invention can comprise any material and/or construction consistent with providing the photosensitive element a response to the desired wavelength range of electromagnetic radiation. In some embodiments, photosensitive elements comprise photodiodes utilizing various semiconductor materials in the formation of pn junctions or p-i-n junctions. In some embodiments, semiconductor materials used in the formation of photodiode heterojunctions comprise Group III/V semiconductors, Group II/VI semiconductors or combinations thereof. In one embodiment wherein the absorption of SWIR is desired, a photodiode comprising InGaAs can be provided. In some embodiments, InGaAs comprises $In_{0.53}Ga_{0.47}As$.

Moreover, a photosensitive element of a photodetector, in some embodiments of the present invention, comprises a single pixel constructed of a material having the desired absorption spectrum. In other embodiments, a photosensitive element of a photodetector comprises a plurality of pixels. A plurality of pixels, in some embodiments, comprises a one dimensional array or a two dimensional array of pixels.

In some embodiments, photosensitive elements of a photodetector of the present invention have the same pixel pitch. In other embodiments, photosensitive elements of a photodetector have different pixel pitches.

In another embodiment, the present invention provides a photodetector comprising a read-out integrated circuit, a first photosensitive element electrically connected to the read-out integrated circuit and a second photosensitive element at least partially covering the first photosensitive element and electrically connected to the read-out integrated circuit by one or more electrical connections passing through the first photosensitive element, the second photosensitive element absorbing electromagnetic radiation of a longer wavelength than the first photosensitive element.

In another embodiment, the present invention provides one or more arrays of photodetectors coupled to a read-out integrated circuit wafer, wherein at least one of the photodetectors comprises a first photosensitive element electrically connected to the read-out integrated circuit wafer and a second photosensitive element at least partially covering the first photosensitive element and electrically connected to the read-out integrated circuit wafer by one or more electrical connections passing through the first photosensitive element, the second photosensitive element absorbing electromagnetic radiation of a longer wavelength than the first photosensitive element.

As described herein, the first photosensitive element and the second photosensitive element are arranged in a stacked configuration wherein the second photosensitive element at least partially covers the first photosensitive element. As a result, in some embodiments, electromagnetic radiation received by a photodetector of the present invention reaches the second photosensitive element prior to reaching the first photosensitive element. In embodiments of the present invention, the second photosensitive element comprises a composition and/or structure operable to pass radiation to the first photosensitive element for detection while absorbing radiation outside the absorption spectrum of the first photosensitive element.

In some embodiments of a stacked configuration, the second photosensitive element is adjacent to the first photosensitive element. In other embodiments, the second photosensitive element is spaced apart from the first photosensitive element. In some embodiments wherein the second photosensitive element is spaced apart from the first photosensitive element, a space or void can exist between the first and second photosensitive elements. In other embodiments, a radiation transmissive material can be disposed between the first and second photosensitive elements. A radiation transmissive material, as used herein, refers to a material that does not absorb or otherwise interfere with the transmission of electromagnetic radiation to be absorbed by the first and/or second photosensitive elements of the present invention.

Spacing the second photosensitive element apart from the first photosensitive element by a void or an intervening radiation transmissive material, in some embodiments, can isolate the second photosensitive element from the first photosensitive element. As discussed further herein, spacing the second photosensitive element apart from the first photosensitive element is desirable in some embodiments wherein the second photosensitive element requires thermal isolation to minimize dark currents and other environmental factors that degrade the response of the second photosensitive element.

In some embodiments, spacing the second photosensitive element from the first photosensitive element can be achieved by extending one more electrical connections disposed in accessways of the first photosensitive element above a surface of the first photosensitive element. In such embodiments, the one or more electrical connections can serve as a spacer in addition to placing the second photosensitive element in electrical communication with the read-out integrated circuit.

In another aspect, the present invention provides methods of producing photodetectors. In one embodiment, a method of producing a photodetector comprises providing a first photosensitive element comprising one or more electrical contacts for connecting to a read-out integrated circuit, providing at least one accessway through the first photosensitive element and at least partially disposing an electrical connection in the at least one accessway for receiving a second photosensitive element. In some embodiments, a method of producing a photodetector further comprises providing a second photosensitive element and coupling the second photosensitive element to the electrical connection.

In another embodiment, a method of producing a photodetector comprises providing a read-out integrated circuit, electrically connecting a first photosensitive element to the read-out integrated circuit and electrically connecting a second photosensitive element to the read-out integrated circuit by one more connections passing through the first photosensitive element, wherein the second photosensitive element absorbs electromagnetic radiation of a wavelength longer than the first photosensitive element. In some embodiments, the second photosensitive element at least partially covers the first photosensitive element when electrically connected to the read-out integrated circuit by one or more connections passing through the first photosensitive element.

Moreover, in some embodiments, methods of producing photodetectors of the present invention further comprise spacing the second photosensitive element from the first photosensitive element. In some embodiments, a method of the present invention further comprises providing at least one accessway in the second photosensitive element and at least partially disposing an electrical connection in the at least one accessway for receiving a third photosensitive element. In some embodiments, a method of the present invention further comprises providing a third photosensitive element and coupling the third photosensitive element to the electrical connection.

In another aspect, the present invention provides methods of detecting a plurality of wavelength ranges of electromagnetic radiation. In one embodiment, a method of detecting a plurality of wavelength ranges comprises providing a photodetector comprising a read-out integrated circuit, a first photosensitive element electrically connected to the read-out integrated circuit and a second photosensitive element electrically connected to the read-out integrated circuit and spaced apart from the first photosensitive element by one or more connections passing through the first photosensitive element and detecting electromagnetic radiation of a first wavelength range with the first photosensitive element and detecting electromagnetic radiation of a second wavelength range with the second photosensitive element.

In another embodiment, a method of detecting a plurality of wavelength ranges comprises providing a photodetector comprising a read-out integrated circuit, a first photosensitive element electrically connected to the read-out integrated circuit and a second photosensitive element electrically connected to the read-out integrated circuit by one or more connections passing through the first photosensitive element and detecting electromagnetic radiation of a first wavelength range with the first photosensitive element and detecting electromagnetic radiation of a second wavelength range with the second photosensitive element, wherein the electromagnetic radiation of the second range has one or more wavelengths longer than the electromagnetic radiation of the first range.

These and other embodiments are described in greater detail in the detailed description which follows.

BRIEF DESCRIPTION OF THE DRAWINGS

FIGS. 3(a)-(e) illustrate a method of producing a photodetector according to one embodiment of the present invention.

FIGS. 4(a)-(e) illustrate a method of producing a photodetector according to one embodiment of the present invention.

FIGS. 6(a)-(d) illustrate a method of integrating a second photosensitive element with a first photosensitive element assembly according to one embodiment of the present invention.

FIGS. 7(a)-(c) illustrate a method of producing a photodetector wherein a first photosensitive element assembly is coupled to a second photosensitive element assembly.

FIGS. 8(a)-(d) illustrate wafer level assembly of photodetectors according to one embodiment of the present invention.

FIGS. 9(a)-(d) illustrate wafer level assembly of photodetectors according to one embodiment of the present invention.

DETAILED DESCRIPTION

The present invention can be understood more readily by reference to the following detailed description, examples and drawings and their previous and following descriptions. Elements, apparatus and methods of the present invention, however, are not limited to the specific embodiments presented in the detailed description, examples and drawings. It should be recognized that these embodiments are merely illustrative of the principles of the present invention. Numerous modifications and adaptations will be readily apparent to those of skill in the art without departing from the spirit and scope of the invention.

The present invention provides photodetectors and components thereof having multi-spectral sensing capabilities. In some embodiments, the present invention provides photodetectors comprising a plurality of photosensitive elements in a stacked configuration wherein a second photosensitive element is disposed over a first photosensitive element. The present invention, in some embodiments, provides a first photosensitive element coupled to a read-out integrated circuit, the first photosensitive element having an architecture operable for receiving a second photosensitive element and electrically connecting the second photosensitive element to the read-out integrated circuit. In some embodiments, for example, the first photosensitive element coupled to the read-out integrated circuit comprises an architecture facilitating the construction or processing of a second photosensitive element over the first photosensitive element resulting in a stacked configuration. In some embodiments, for example, the architecture of the first photosensitive element coupled to the read-out integrated circuit permits the construction or deposition of delicate long wavelength photosensitive structures over the first photosensitive element in the production of a photodetector having multi-spectral sensing capabilities.

In one embodiment, the present invention provides a photodetector comprising a first photosensitive element comprising one or more electrical connections for coupling to a read-out integrated circuit and at least one accessway extending through the element and an electrical connection at least partially disposed in the accessway, the electrical connection accessible for receiving a second photosensitive element. As provided herein, the accessible electrical connection, in some embodiments, permits electrical communication of a second photosensitive element with the read-out integrated circuit, the second photosensitive element being deposited, constructed or hybridized over the first photosensitive element in a stacked configuration. In some embodiments, the first photosensitive element comprises a plurality of accessways having an electrical connection at least partially disposed therein and accessible for receiving a second photosensitive element.

Figure 1:
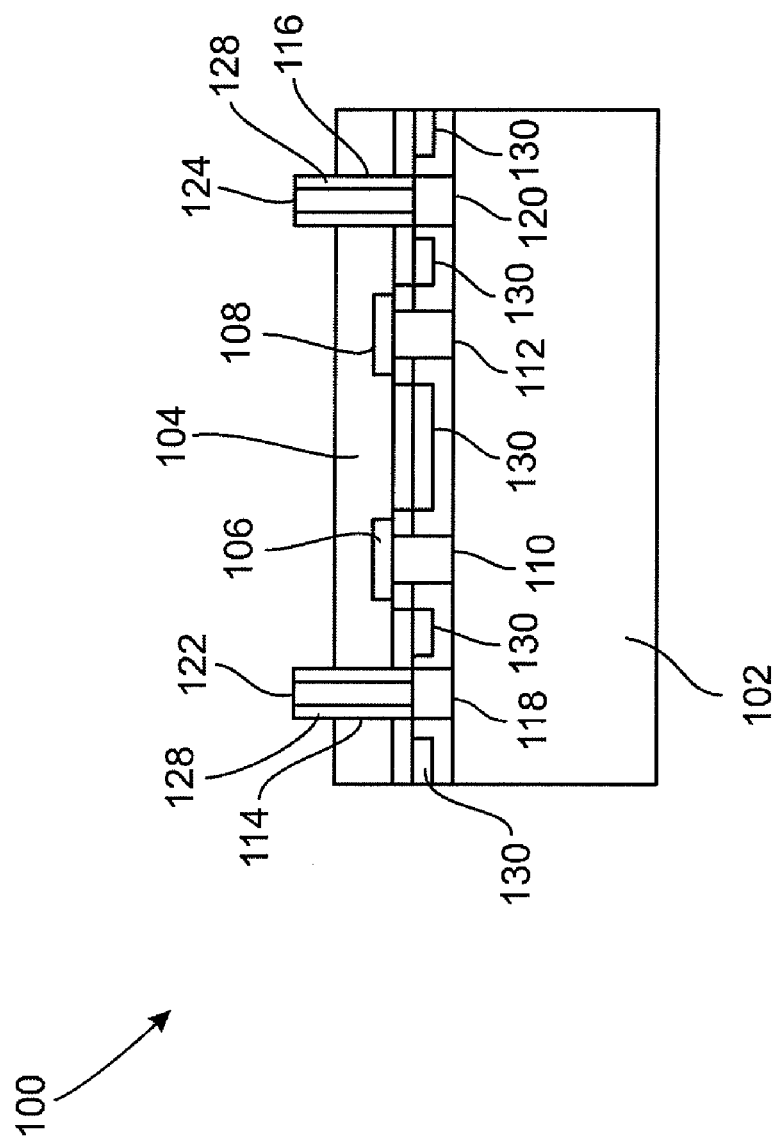
FIG. 1 illustrates a cross-sectional view of a photodetector according to one embodiment of the present invention.

Referring now to the figures, FIG. 1 illustrates a cross-sectional view of a photodetector according to one embodiment of the present invention. The photodetector (100) of FIG. 1 comprises a read-out integrated circuit (102) and a first photosensitive element (104). The first photosensitive element (104) comprises a plurality of photodiode pixels (106, 108) comprised of pn junctions or p-i-n junctions. In the embodiment illustrated in FIG. 1, p-contacts (110, 112) electrically connect the p-regions of the pixel photodiodes (106, 108) to the read-out integrated circuit. The n-contacts (not shown) for the n-regions of the pixel photodiodes, in some embodiments, can be disposed between the pixel photodiodes (106, 108) or at the periphery of the photodetector (100). The first photosensitive element (104) also comprises two accessways (114, 116) passing through the first photosensitive element (104). Each accessway (114, 116) terminates in an electrical contact (118, 120) coupled to the read-out integrated circuit (102). Insulating materials (130) are also provided to prevent shorting of electrical connections during integration of the first photosensitive element (104) with the read-out integrated circuit (102).

In some embodiments, an accessway passing through the first photosensitive element of a photodetector of the present invention has a diameter equal to the thickness of the first photosensitive element. In other embodiments, an accessway passing through the first photosensitive element has a diameter ranging from about 0.25 µm to about 25 µm or from about 1 µm to about 15 µm. In another embodiment, an accessway passing through the first photosensitive element has a diameter ranging from about 2 µm to about 5 µm.

In some embodiments, an accessway is generated in the first photosensitive element by etching the first photosensitive element. The first photosensitive element, in some embodiments, for example, can be patterned with a resist and subsequently etched. In some embodiments, etching comprises a wet etch. Wet etching, in some embodiments, comprises exposing the first photosensitive element to an etch composition comprising an acid or a base, and/or an oxidizing agent. In one embodiment, for example, a wet etch composition comprises a phosphoric acid/hydrogen peroxide solution or a citric acid/hydrogen peroxide solution.

In some embodiments, etching comprises a dry etch. A dry etch, in some embodiments, comprises a reactive ion etch or an inductively coupled plasma etch. In some embodiments, for example, reactive ion etches or inductively coupled plasma etches include chemical species including, but not limited to, argon, $SiCl_4$, $BCl_3$, $SF_6$ or $O_2$.

Referring once again to FIG. 1, electrical connections (122, 124) are disposed in accessways (114, 116). An electrically insulating material (128) is also disposed in the accessways (114, 116) to isolate electrical connections (122, 124) from the first photosensitive element (104).

The combined thickness of an electrical connection and insulating material, in some embodiments, is sufficient to fill the accessway. Electrical connections and insulating materials disposed in accessways of photodetectors described herein can have any thickness not inconsistent with the objectives of the present invention. In one embodiment, for example, an insulating material disposed in an accessway has a thickness ranging from about 5 nm to about 3 µm with the remaining volume of the accessway being occupied by the electrical connection.

Electrical contacts and connections of photonic devices of the present invention can comprise elementally pure metals or metal alloys. In some embodiments, electrical contacts and connections of photonic devices comprise nickel, copper, chromium, tungsten, titanium or tantalum or alloys thereof. Moreover, insulating materials used in photonic devices of the present invention, in some embodiments, comprise silicon oxides, silicon nitrides, titanium oxides, titanium nitrides, tantalum oxides or combinations thereof. In some embodiments, insulating materials comprise polymeric materials.

In the embodiment illustrated in FIG. 1, electrical connections (122, 124) extend above the surface of the first photosensitive element (104) and are accessible for receiving a second photosensitive element. In some embodiments, the insulating material (128) encapsulates the electrical connections (122, 124) until a second photosensitive element is deposited, hybridized or otherwise processed onto electrical connections (122, 124). As electrical connections (122, 124) terminate in electrical contacts (118, 120) coupled to the read-out integrated circuit, electrical connections (122, 124) can place a second photosensitive element in electrical communication with the read-out integrated circuit.

Figure 2:
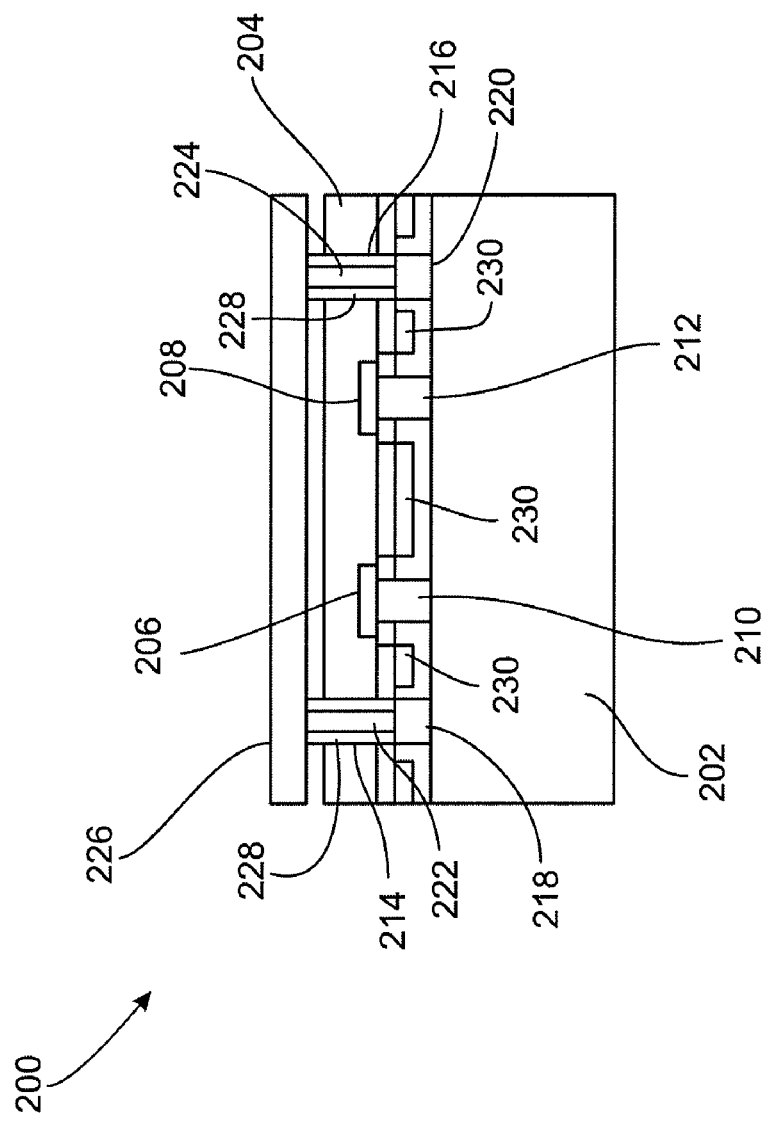
FIG. 2 illustrates a cross-sectional view of a photodetector according to one embodiment of the present invention.

FIG. 2 is a cross-sectional view of a photodetector according to one embodiment of the present invention wherein the accessible electrical connections disposed in accessways of the first photosensitive element have received a second photosensitive element. The photodetector illustrated in FIG. 2 comprises a read-out integrated circuit (202) and a first photosensitive element (204). The first photosensitive element (204) comprises a plurality of photodiode pixels (206, 208) comprised of pn junctions or p-i-n junctions. In the embodiment illustrated in FIG. 2, p-contacts (210, 212) electrically connect the p-regions of the pixel photodiodes (206, 208) to the read-out integrated circuit. The n-contacts (not shown) for the n-regions of the pixel photodiodes, in some embodiments, can be disposed between the pixel photodiodes (206, 208) or at the periphery of the photodetector (200). The first photosensitive element (204) also comprises two accessways (214, 216) passing through the first photosensitive element (204). Each accessway (214, 216) terminates in an electrical contact (218, 220) coupled to the read-out integrated circuit (202). Insulating materials (230) are also provided to prevent shorting of electrical connections during integration of the first photosensitive element (204) with the read-out integrated circuit (202).

Electrical connections (222, 224) are disposed in accessways (214, 216). An electrically insulating material (228) is also disposed in the accessways (214, 216) to isolate electrical connections (222, 224) from the first photosensitive element (204). In the embodiment illustrated in FIG. 2, electrical connections (222, 224) extend above the surface of the first photosensitive element (204) and are accessible for receiving a second photosensitive element (226). The second photosensitive element (226) is coupled to electrical connections (222, 224). In coupling the electrical connections (222, 224), the second photosensitive element at least partially covers the first photosensitive element (204) in a stacked configuration. Moreover, electrical connections (222, 224) can place the second photosensitive element (226) in electrical communication with the read-out integrated circuit (202).

In some embodiments, the second photosensitive element (226) can be coupled with electrical connections (222, 224) in any manner not inconsistent with the objectives of the present invention. In some embodiments, the second photosensitive element (226) is epitaxially grown or otherwise deposited on electrical connections (222, 224). In other embodiments, the second photosensitive element (226) is pre-fabricated and subsequently coupled to electrical connections (222, 224).

In the embodiment illustrated in FIG. 2, electrical connections (222, 224) extend above the first photosensitive element (204). Extension above the surface of the first photosensitive element (204), permits electrical connections (222, 224) to act as a spacer thereby spacing the second photosensitive element (226) apart from the first photosensitive element (204). In some embodiments, contacts (not shown) of the second photosensitive element (226) for interfacing with electrical connections (222, 224) extend above the surface of the second photosensitive element (228) and can also act as spacers in conjunction with electrical connections (222, 224) to increase the distance from the first photosensitive element (204). In some embodiments, electrical connections (224, 226) do not extend above a surface of the first photosensitive element and are substantially co-planar with a surface of the first photosensitive element.

The first and second photosensitive elements of a photodetector can be spaced apart by any desired amount. In some embodiments, the first and second photosensitive elements can be spaced apart by a distance of up to about 25 µm. In other embodiments, the first and second photosensitive elements of a photodetector are spaced apart by a distance ranging from about 1 µm to about 20 µm. In another embodiment, the first and second photosensitive elements are spaced apart by a distance ranging from about 2 µm to about 10 µm. In some embodiments, the first and second photosensitive elements are spaced apart by a distance ranging from about 3 µm to about 5 µm. In another embodiment, the first and second photosensitive elements are spaced apart by a distance less than about 1 µm or greater than about 25 µm.

Moreover, in some embodiments, a radiation transmissive material can be disposed in the space or void between the first photosensitive element and the second photosensitive element. Disposing a radiation transmissive material in the space between the first and second photosensitive elements, in some embodiments, can add mechanical stability to the photodetector. Disposing a radiation transmissive material in the space between the first and second photosensitive elements can also assist in isolation, including thermal isolation, of the second photosensitive element. As the second photosensitive element absorbs electromagnetic radiation of a longer wavelength than the first photosensitive element, thermal isolation of the second photosensitive element to minimize dark currents and other environmental factors that degrade element response can be advantageous.

Additionally, in some embodiments, the first photosensitive element of a photodetector further comprises one or more reflective surfaces operable to reflect electromagnetic radiation not absorbed by the second photosensitive element and/or first photosensitive element. In some embodiments, one or more reflective surfaces are disposed on a surface of the first photosensitive element proximate to the second photosensitive element. In such embodiments, the one or more reflective surfaces can reflect electromagnetic radiation having a wavelength range absorbed by the second photosensitive element, thereby providing radiation not absorbed in the first pass through the second photosensitive element an additional chance of absorption by the second photosensitive element. When disposed on a surface of the first photosensitive element proximate to the second photosensitive element, a reflective surface, in some embodiments, does not interfere with or reflect radiation of a wavelength range absorbed by the first photosensitive element.

In another embodiment, one or more reflective surfaces can be disposed within the first photosensitive element and/or on a surface distal to the second photosensitive element. In such embodiments, the reflective surface(s) can reflect radiation having a wavelength range absorbed by the first and/or second photosensitive elements, thereby providing radiation missed in the first pass through the first and second photosensitive elements an additional opportunity for absorption.

In some embodiments, reflective surfaces can comprises any reflective material operable to reflect the desired wavelength of radiation. Reflective surfaces, in some embodiments, comprise metals including, but not limited to, gold, silver, aluminum, titanium, copper, platinum or palladium or alloys thereof. In some embodiments, reflective surfaces comprise a stack of one or more metals. Moreover, in some embodiments, reflective surfaces can be deposited on surfaces or the first photosensitive element or grown into the materials of first photosensitive element.

Referring once again to FIG. 2, the second photosensitive element (226) is disposed above and at least partially covers the first photosensitive element (204) in a stacked configuration. As discussed herein, electromagnetic radiation received by the photodetector (200) reaches the second photosensitive element (226) before reaching the first photosensitive element (204). As a result, in some embodiments of the present invention, the second photosensitive element (226) comprises a composition and/or structure operable to pass radiation of a wavelength suitable for absorption by the first photosensitive element (204).

As provided herein, the first (204) and second (226) photosensitive elements can have any desired absorption spectra. In some embodiments, the first photosensitive element (204) absorbs electromagnetic radiation of a wavelength longer than the second photosensitive element (226). In such embodiments, the second photosensitive element (226) does not substantially interfere with longer wavelength radiation to be absorbed by the first photosensitive element (204). In some embodiments, the first photosensitive element (204) absrobs LWIR and/or MWIR radiation while the second photosensitive element (226) absorbs visible and/or SWIR radiation.

In another embodiment, the second photosensitive element (226) absorbs electromagnetic radiation of a longer wavelength than the first photosensitive element (204). In such embodiments, the second photosensitive element (226) can display a composition or structure that does not interfere or substantially interfere with passage of shorter wavelength radiation for absorption by the first photosensitive element (204). In one embodiment, for example, the second photosensitive element (226) has a thickness that inhibits or precludes significant attenuation of shorter wavelength light, thereby passing a suitable amount of shorter wavelength light to the first photosensitive element (204) for detection. In some embodiments, the second photosensitive element (226) absorbs LWIR and/or MWIR electromagnetic radiation and the first photosensitive element absorbs visible and/or SWIR radiation.

Moreover, in some embodiments, the first (204) and second (226) photosensitive elements absorb different wavelengths of radiation classified in the same region of the electromagnetic spectrum. As described above, in some embodiments, for example, the first (204) and second (226) photosensitive elements absorb radiation in the infrared region of the electromagnetic spectrum where the second photosensitive element (226) absorbs infrared radiation of a longer or shorter wavelength than the infrared radiation absorbed by the first photosensitive element. In some embodiments, the first (204) and second (226) photosensitive elements absorb radiation in the visible region of the electromagnetic spectrum where the second photosensitive element (226) absorbs visible radiation of a longer or shorter wavelength than the visible radiation absorbed by the first photosensitive element (204). The first (204) and second photosensitive (226) elements, in some embodiments, absorb radiation in the ultraviolet region of the electromagnetic spectrum where the second photosensitive element (226) absorbs ultraviolet radiation of a longer or shorter wavelength than the ultraviolet radiation absorbed by the first photosensitive element (204)

Additionally, the second photosensitive element (226) is provided as a single pixel in the embodiment illustrated in FIG. 2. As a result, the pixel pitch of the first photosensitive element (204) is different from that of the second photosensitive element (226).

In some embodiments of photodetectors of the present invention, the first photosensitive element and the second photosensitive element are independently connected to the read-out integrated circuit. In embodiments wherein the first and the second photosensitive elements are independently connected to the read-out integrated circuit, photocurrent provided by the first photosensitive element can be completely distinguished from photocurrent provided by the second photosensitive element. In other embodiments, the first and second photosensitive elements can share a common cathode or anode connection when electrically coupled to the read-out integrated circuit. Sharing a common cathode or anode, in some embodiments, can reduce the wiring complexity of the photodetector. In another embodiment, the first and second photosensitive elements are connected serially (the anode of one photosensitive element connected to the cathode of another photosensitive element) or in parallel (two anodes connected and two cathodes connected wherein the grouped anodes and grouped cathodes are connected to the read-out integrated circuit independent of one another). Such an arrangement would combine the photocurrent from the first and second photosensitive elements.

In some embodiments, the second photosensitive element of a photodetector of the present invention comprises at least one accessway extending through the element and an electrical connection at least partially disposed in the accessway for receiving a third photosensitive element. The electrical connection of the second photosensitive element, in some embodiments, facilitates electrical communication of a third photosensitive element with the read-out integrated circuit, the third photosensitive element being deposited, constructed or hybridized over the second photosensitive element in a stacked configuration. In some embodiments, the second photosensitive element comprises a plurality of accessways, each accessway having an electrical connection at least partially disposed therein and accessible for receiving a third photosensitive element.

A photosensitive element of a photodetector of the present invention can comprise any material and/or construction consistent with providing the photosensitive element a response to the desired wavelength range of electromagnetic radiation. In some embodiments, photosensitive elements comprise one or more photodiode pixels utilizing various semiconductor materials in the formation of pn junctions or p-i-n junctions. In some embodiments, semiconductor materials used in the formation heterojunctions of photodiodes comprise Group III/V semiconductors, Group II/VI semiconductors or combinations thereof. In one embodiment wherein the absorption of SWIR is desired, a photodiode comprising InGaAs can be provided.

In some embodiments, InGaAs comprises $In_{0.53}Ga_{0.47}As$. In some embodiments wherein the absorption of MWIR and/or LWIR is desired, photodiodes comprising Group IIVV type-II superlattices or HgCdTe are provided.

In some embodiments, photosensitive elements can be constructed according to the materials and methods disclosed in U.S. Pat. Nos. 6,573,581 and 6,489,635, which are incorporated by reference herein in their entireties.

Photosensitive elements of the present invention have any desired thickness not inconsistent with the objectives of the present invention. In some embodiments, a photosensitive element has a thickness ranging from about 0.25 μm to about 25 μm. In other embodiments, a photosensitive element has a thickness ranging from about 1 μm to about 15 μm or from about 2 μm to about 10 μm. In another embodiment, a photosensitive element has a thickness ranging from about 3 μm to about 5 μm. In a further embodiment, a photosensitive element has a thickness less than about 0.25 μm or greater than about 25 μm.

In another embodiment, the present invention provides a photodetector comprising a read-out integrated circuit, a first photosensitive element electrically connected to the read-out integrated circuit and a second photosensitive element at least partially covering the first photosensitive element and electrically connected to the read-out integrated circuit by one or more electrical connections passing through the first photosensitive element, wherein the second photosensitive element absorbs electromagnetic radiation of a longer wavelength than the first photosensitive element.

In another embodiment, the present invention provides one or more arrays of photodetectors coupled to a read-out integrated circuit wafer, wherein at least one of the photodetectors comprises a first photosensitive element electrically connected to the read-out integrated circuit wafer, the first photosensitive element having an accessway extending through the element and an electrical connection at least partially disposed in the accessway for receiving a second photosensitive element.

In another embodiment, at least one photodetector of an array comprises a first photosensitive element electrically connected to the read-out integrated circuit wafer and a second photosensitive element at least partially covering the first photosensitive element and electrically connected to the read-out integrated circuit wafer by one or more electrical connections passing through the first photosensitive element, the second photosensitive element absorbing electromagnetic radiation of a longer wavelength than the first photosensitive element.

In some embodiments, an array of photodetectors comprises a focal plane array. In some embodiments of a focal plane array, each photodetector is a pixel in the array. In some embodiments, a focal plane array comprises a one-dimensional array. A one dimensional array, in some embodiments, comprises from 1×128 pixels to 1×4096 pixels. In some embodiments, a focal plane array comprises a two-dimensional array. A two-dimensional array, in some embodiments, comprises from 128×128 pixels to 2048×2048 pixels.

In another aspect, the present invention provides methods of producing photodetectors. In one embodiment, a method of producing a photodetector comprises providing a first photosensitive element comprising one or more electrical contacts for connecting to a read-out integrated circuit, providing at least one accessway through the first photosensitive element and at least partially disposing an electrical connection in the at least one accessway for receiving a second photosensitive element. In some embodiments, a method of producing a photodetector further comprises providing a second photosensitive element and coupling the second photosensitive element to the electrical connection.

In another embodiment, a method of producing a photodetector comprises providing a read-out integrated circuit, electrically connecting a first photosensitive element to the read-out integrated circuit and electrically connecting a second photosensitive element to the read-out integrated circuit by one more connections passing through the first photosensitive element, wherein the second photosensitive element absorbs electromagnetic radiation of a wavelength longer than the first photosensitive element. In some embodiments, the second photosensitive element at least partially covers the first photosensitive element when electrically connected to the read-out integrated circuit by one or more connections passing through the first photosensitive element.

Moreover, in some embodiments, methods of producing photodetectors of the present invention further comprise spacing the second photosensitive element from the first photosensitive element. In some embodiments, a method of the present invention further comprises providing at least one accessway in the second photosensitive element and at least partially disposing an electrical connection in the at least one accessway for receiving a third photosensitive element. In some embodiments, a method of the present invention further comprises providing a third photosensitive element and coupling the third photosensitive element to the electrical connection.

Referring once again to the figures, FIGS. 3(a)-(e) illustrate a method of producing a photodetector according to one embodiment of the present invention. The photodetector produced in FIGS. 3(a)-(e) comprises a read-out integrated circuit and a first photosensitive element electrically coupled to the read-out integrated circuit, the first photosensitive element comprising a plurality of accessways extending through the element, wherein each accessway comprises an electrical connection accessible for receiving a second photosensitive element.

FIG. 3(a) illustrates a cross-sectional view of a first photosensitive element assembly (300) for electrical coupling to a read-out integrated circuit (302). The first photosensitive element assembly (300) comprises a first photosensitive element (304). The first photosensitive element (304) comprises a plurality of photodiode pixels (306, 308) comprised of pn junctions or p-i-n junctions. In the embodiment illustrated in FIG. 3, p-contacts (310, 312) electrically connect the p-regions of the pixel photodiodes (306, 308) to the read-out integrated circuit. The n-contacts (not shown) for the n-regions of the pixel photodiodes, in some embodiments, can be disposed between the pixel photodiodes (306, 308) or at the periphery of the photodetector. One or a plurality of insulating materials (314) are also provided in the first photosensitive element assembly (300) to prevent shorting of electrical connections during integration of the assembly (300) with the read-out integrated circuit (302). In some embodiments, the insulating materials (314) can serve as a spacer between the first photosensitive element assembly (300) and the read-out integrated circuit (302). The first photosensitive element assembly (300) further comprises an etch stop or release layer (316) disposed between the photosensitive element (304) and a substrate (318).

FIG. 3(b) illustrates a cross-sectional view of the first photosensitive element assembly (300) electrically coupled to the read-out integrated circuit (302). An underflow material (338) can be disposed between the read-out integrated circuit (302) and the first photosensitive element (304).

The substrate (318) and the etch stop or release layer (316) are removed from the photosensitive element (304) once the first photosensitive element assembly (300) is electrically coupled to the read-out integrated circuit (302), as illustrated in FIG. 3(c). Following removal of the substrate (318) and the etch stop or release layer (316), accessways (320, 322) are formed through the photosensitive element (304) as provided in FIG. 3(d). Electrical connections (324, 326) accessible for receiving a second photosensitive element are disposed in the accessways (320, 322) and isolated from the first photosensitive element (304) by an insulating material (328) as illustrated in FIG. 3(e). Electrical connections (324, 326) contact the read-out integrated circuit (302) and can be used to provide a received second photosensitive element (not shown) in electrical communication with the read-out integrated circuit.

FIGS. 4(a)-(e) also illustrate a method of producing a photodetector according to one embodiment of the present invention. As in FIGS. 3(a)-(e), the photodetector produced in FIGS. 4(a)-(e) comprises a read-out integrated circuit and a first photosensitive element electrically coupled to the read-out integrated circuit, the first photosensitive element comprising a plurality of accessways extending through the element, wherein each accessway comprises an electrical connection for receiving a second photosensitive element.

FIG. 4(a) illustrates a cross-sectional view of a first photosensitive element assembly (400) provided for electrical coupling to a read-out integrated circuit (402). The first photosensitive element assembly (400) comprises a photosensitive element (404). The first photosensitive element (404) comprises a plurality of photodiode pixels (406, 408) comprised of pn junctions or p-i-n junctions. In the embodiment illustrated in FIG. 4, p-contacts (410, 412) electrically connect the p-regions of the pixel photodiodes (406, 408) to the read-out integrated circuit. The n-contacts (not shown) for the n-regions of the pixel photodiodes, in some embodiments, can be disposed between the pixel photodiodes (406, 408) or at the periphery of the photodetector (400). Insulating materials (414) are also provided in the first photosensitive element assembly (400) to prevent shorting of electrical connections during integration of the assembly (400) with the read-out integrated circuit (402). In some embodiments, the insulating materials (414) can serve as a spacer between the first photosensitive element assembly (400) and the read-out integrated circuit (402).

The first photosensitive element assembly (400) further comprises an etch stop or release layer (416) disposed between the photosensitive element (404) and a substrate (418). In comparison with first photosensitive element assembly (300) of FIGS. 3(a)-(e), the first photosensitive element assembly (400) of FIGS. 4(a)-(e) further comprises accessible electrical contacts (420, 422), which eventually assist connecting a second photosensitive element (not shown) to the read-out integrated circuit (402).

FIG. 4(b) illustrates a cross-sectional view of the first photosensitive element assembly (400) electrically coupled to the read-out integrated circuit (402). The substrate (418) and the etch stop or release layer (416) are removed from the photosensitive element (404), once the first photosensitive element assembly (400) is connected to the read-out integrated circuit, as illustrated in FIG. 4(c). Moreover, an underflow material (426) can be disposed between the read-out integrated circuit (402) and the first photosensitive element (404). Following removal of the substrate (418) and the etch stop or release layer (416), accessways (428, 430) are formed through the photosensitive element (402) as provided in FIG. 4(d). Accessways (428, 430) are formed through the first photosensitive element (404) at locations corresponding to electrical contacts (420, 422). Initially providing electrical contacts (420, 422) with the first photosensitive element assembly (400) precludes forming accessways (428, 430) to the surface of the read-out integrated circuit (402).

Electrical connections (432, 434) are disposed in the accessways (428, 430) and isolated from the first photosensitive element (404) by an insulating material (436) as illustrated in FIG. 4(e). The electrical connections (432, 434) are accessible for receiving a second photosensitive element and can be used to provide the second photosensitive element in electrical communication with the read-out integrated circuit (402).

Figure 5A:
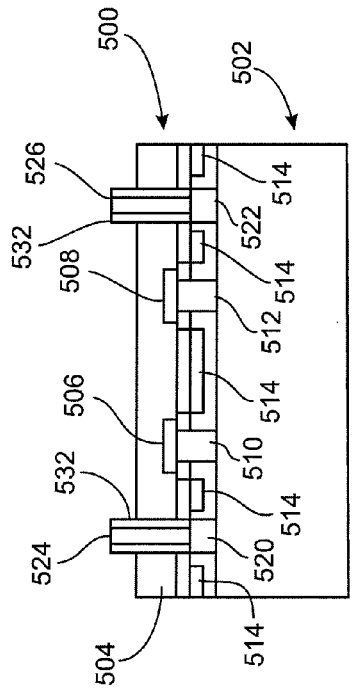
FIGS. 5(a)-(d) illustrate a method of producing a photodetector according to one embodiment of the present invention.

FIGS. 5(a)-(d) illustrate a method of producing a photodetector according to one embodiment of the present invention. FIG. 5(a), illustrates a cross-sectional view of a first photosensitive element assembly (500) provided for electrical coupling to a read-out integrated circuit (502). The first photosensitive element assembly (500) comprises a photosensitive element (504). The first photosensitive element (504) comprises a plurality of photodiode pixels (506, 508) comprised of pn junctions or p-i-n junctions. In the embodiment illustrated in FIG. 3, p-contacts (510, 512) electrically connect the p-regions of the pixel photodiodes (506, 508) to the read-out integrated circuit. The n-contacts (not shown) for the n-regions of the pixel photodiodes, in some embodiments, can be disposed between the pixel photodiodes (506, 508) or at the periphery of the photodetector (500).

Insulating materials (514) are also provided in the first photosensitive element assembly (500) to prevent shorting of electrical connections during integration of the assembly (500) with the read-out integrated circuit (502). In some embodiments, the insulating materials (514) can serve as a spacer between the first photosensitive element assembly (500) and the read-out integrated circuit (502). The first photosensitive element assembly (500) further comprises an etch stop or release layer (516) disposed between the photosensitive element (504) and a substrate (518).

The first photosensitive element assembly (500) of FIGS. 5(a)-(e) further comprises electrical contacts (520, 522) in communication with electrical connections (524, 526) disposed in accessways (528, 530) extending through the first photosensitive element (504). An insulating material (532) isolates the electrical connections (524, 526) from the first photosensitive element (504). As provided herein, electrical connections (524, 526) are eventually accessible for receiving a second photosensitive element.

Figure 5B:
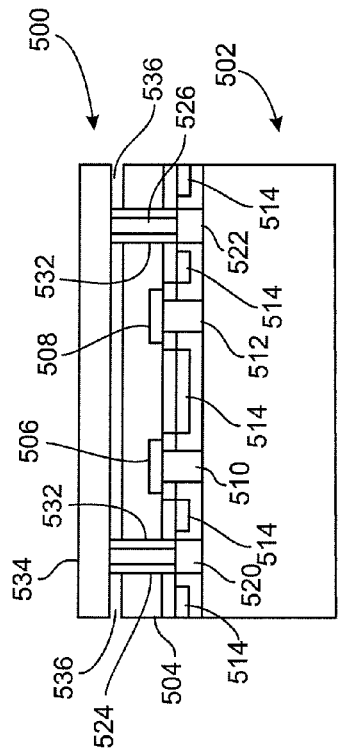

FIG. 5(b) illustrates a cross-sectional view of the first photosensitive element assembly (500) electrically coupled to the read-out integrated circuit (502). In contrast to the previously illustrated methods, accessways (528, 530), electrical connections (524, 526) and contacts (520, 524) are all provided to the first photosensitive element assembly (500) prior to coupling of the assembly (500) with the read-out integrated circuit (502).

In forming the accessways (528, 530) and electrical connections (524, 526) through the first photosensitive element prior to coupling with a read-out integrated circuit (502), the dimensions of the accessways (528, 530) and the resulting electrical contacts (524, 526) can be varied. As illustrated in FIGS. 5(a) and (b), accessways (528, 530) pass through the first photosensitive element (504) and into the etch stop or release layer (516) and substrate (518). As provided herein, electrical connections (524, 526) and insulating material (532) are subsequently disposed in the accessways (528, 530).

Figure 5C:
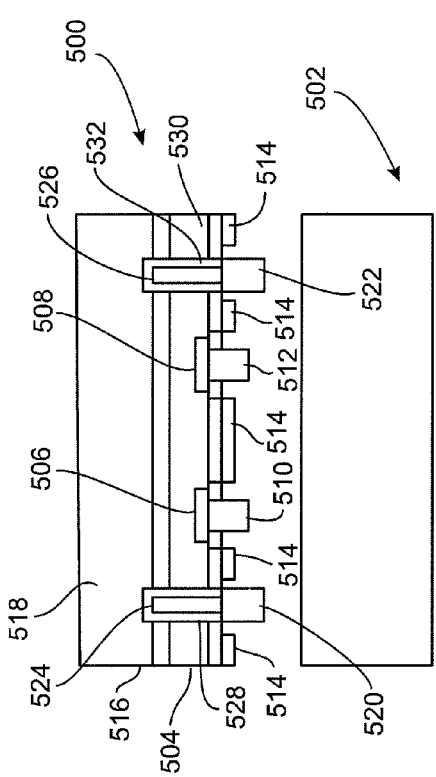

The etch stop or release layer (516) and the substrate (518) can be removed once the first photosensitive element assembly (500) is coupled to the read-out integrated circuit (502), thereby making electrical connections (524, 526) accessible for receiving a second photosensitive element. As illustrated in FIG. 5(c), electrical connections (524, 526) extend above the surface of the first photosensitive element (500). A second photosensitive element (534) can be received by the electrical connections (524, 526) and placed in electrical communication with the read-out integrated circuit (502). Insulating material (532) covering electrical connections (524, 526) is removed prior to coupling with the second photosensitive element (530).

Figure 5D:
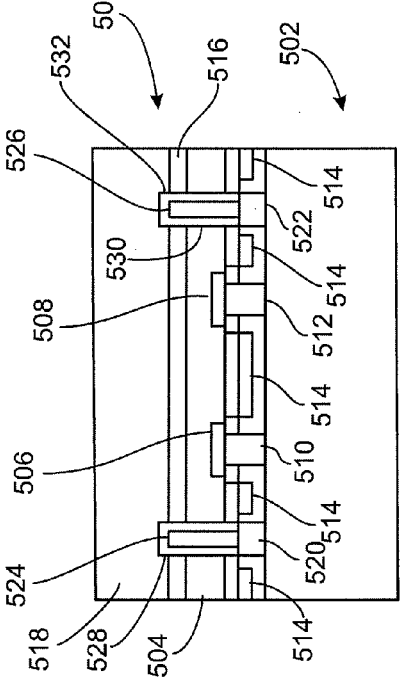

In extending above the surface of the first photosensitive element (504), electrical connections (524, 526) can act as a spacer between the first photosensitive element (504) and the second photosensitive element (534), thereby providing a space or void (536) between the first (504) and second (534) photosensitive elements, as illustrated in the cross-sectional view of FIG. 5(d). In some embodiments, the dimensions of the space or void (536) correspond to the distance by which the electrical connections (524, 526) extend above the surface of the first photosensitive element (504). As provided herein, the distance by which electrical connections (524, 526) extend above the surface of the first photosensitive element (504) is determined by the distance accessways (528, 530) extend into the etch stop or release layer (516) and/or substrate (518).

Moreover, in some embodiments, the second photosensitive element (534) comprises electrical contacts (not shown) extending above the surface of the second photosensitive element (534) for coupling to electrical connections (524, 526). Electrical contacts extending above the surface of the second photosensitive element (534) can additionally serve as spacers between the first photosensitive element (504) and the second photosensitive element (534).

In view of the foregoing, in some embodiments, the second photosensitive element (534) is spaced from the first photosensitive element (504) by distance equivalent to the height an electrical connection (524 or 526) extends above the surface of the first photosensitive element (504). In other embodiments, the second photosensitive element (534) is spaced from the first photosensitive element (504) by a distance equivalent to the height by which an electrical contact of the second photosensitive element (534) extends above the surface of the second photosensitive element (534). In another embodiment, the second photosensitive element (534) is spaced from the first photosensitive element (504) by a distance equaling the summation of the height an electrical connection (524 or 526) extends above the first photosensitive element (504) and the height an electrical contact of the second photosensitive element extends above the surface of the second photosensitive element (534).

Integrating a second photosensitive element with a first photosensitive element assembly can be achieved by several methods. FIGS. 6(a)-(d) illustrate one method of integrating a second photosensitive element with a first photosensitive element assembly according to one embodiment of the present invention. FIG. 6(a) provides a cross-sectional view of a first photosensitive element assembly (600) comprising a first photosensitive element (604). The first photosensitive element (604) comprises a plurality of photodiode pixels (606, 608) comprised of pn junctions or p-i-n junctions. In the embodiment illustrated in FIG. 6, p-contacts (610, 612) electrically connect the p-regions of the pixel photodiodes (606, 608) to the read-out integrated circuit. The n-contacts (not shown) for the n-regions of the pixel photodiodes, in some embodiments, can be disposed between the pixel photodiodes (606, 608) or at the periphery of the photodetector.

The first photosensitive element assembly (600) further comprises accessways (616, 618) extending to the read-out integrated circuit (602) through the first photosensitive element (602) and an underfill material (620). Electrical connections (622, 624) operable to receive and place a second photosensitive element in electrical communication with the read-out integrated circuit (604) are disposed in the accessways (616, 618). An insulating material (626) isolates the electrical connections (622, 624) from the first photosensitive element (602). The electrical connections (622, 624) and the associated insulating material (626) extend above the surface of the first photosensitive element (602).

Planarizing and/or sacrificial layer(s), in some embodiments, are applied to the first photosensitive assembly (600) in preparation for deposition of the second photosensitive element, as illustrated in FIG. 6(b). In the cross-sectional view of FIG. 6(b), planarizing and/or sacrificial layer(s) (628) applied to the first photosensitive element assembly (600) do not cover electrical connections (622, 624). In some embodiments, however, planarizing and/or sacrificial layer(s) can work in conjunction with electrical connections (622, 624) and/or the associated insulating material (626) to increase the spacing of a second photosensitive element from the first photosensitive element (602).

Planarizing and sacrificial layers used in the construction of photodetectors of the present invention can comprise any suitable material known to one of skill in the art for serving as a planarizing layer or a sacrificial layer. In some embodiments, planarizing and sacrificial layers comprise one or more polymeric resists.

According to FIG. 6(c), once planarizing and/or sacrificial layer(s) (628) have been deposited on the first photosensitive element assembly (600), the second photosensitive element (630) can be deposited on the planarizing and/or sacrificial layer(s) and placed in electrical communication with the read-out integrated circuit (604) through electrical connections (622, 624). In some embodiments, the second photosensitive element (630) can be deposited by various epitaxial techniques including, but not limited to, vapor phase epitaxy (VPE) such as metalorganic vapor phase epitaxy (MOVPE), molecular beam epitaxy (MBE), atomic layer epitaxy (ALE) or liquid phase epitaxy (LPE). The deposited second photosensitive element (630) is spaced from the first photosensitive element (604).

In some embodiments, as illustrated in FIG. 6(d), planarizing and/or sacrificial layer(s) (628) can be removed to provide a space or void between the first photosensitive element (602) and the second photosensitive element (630). In other embodiments, planarizing and/or sacrificial layer(s) (628) are not removed.

In another embodiment of a method of producing a photodetector of the present invention, a first photosensitive element assembly is coupled to a prefabricated second photosensitive element assembly. FIGS. 7(a)-(c) illustrate a method of producing a photodetector wherein a first photosensitive element assembly is coupled to a pre-fabricated second photosensitive element assembly.

FIG. 7(a) depicts a cross-sectional view of a first photosensitive element assembly (700) coupled to a read-out integrated circuit (702). The first photosensitive element assembly (700) comprises a photosensitive element (704). The photosensitive element (704) comprises a plurality of photodiode pixels (706, 708) comprised of pn junctions or p-i-n junctions. In the embodiment illustrated in FIG. 7, p-contacts (710, 712) electrically connect the p-regions of the pixel photodiodes (706, 708) to the read-out integrated circuit. The n-contacts (not shown) for the n-regions of the pixel photodiodes, in some embodiments, can be disposed between the pixel photodiodes (706, 708) or at the periphery of the photodetector.

One or a plurality of insulating materials (714) are also provided in the first photosensitive element assembly (700) to prevent shorting of electrical connections during integration of the assembly (700) with the read-out integrated circuit (702).

The first photosensitive element assembly (700) further comprises accessways (716, 718) extending to the read-out integrated circuit (702) through the first photosensitive element (704) and the underfill material (720). Electrical connections (722, 724) operable to receive and place a second photosensitive element (732) in electrical communication with the read-out integrated circuit (702) are disposed in the accessways (716, 718). An insulating material (726) isolates the electrical connections (722, 724) from the first photosensitive element (702). The electrical connections (722, 724) and the associated insulating material (726) extend above the surface of the first photosensitive element (702).

The second photosensitive element assembly (730) comprises a second photosensitive element (732) and electrical contacts (734, 736) for coupling to electrical connections (722, 724) of the first photosensitive element assembly (700). In the embodiment shown in FIG. 7(a), electrical contacts (734, 736) extend above the surface of the second photosensitive element (732). As the second photosensitive element assembly (730) is fabricated prior to coupling with the first photosensitive element assembly (700), the second photosensitive element assembly (730) can further comprise etch stop or release layer(s) (738) and a substrate (740).

The second photosensitive element assembly (730) is joined to the first photosensitive element assembly (700) by coupling electrical contacts (734, 736) with electrical connections (722, 724), as illustrated in the cross-sectional view of FIG. 7(b). Moreover, the second photosensitive element (732) is spaced from the first photosensitive element (706) by a distance equaling the summation of the height an electrical connection (722 or 724) extends above the first photosensitive element (706) and the height an electrical contact (734 or 736) extends above the surface of the second photosensitive element (732). Any etch stop or release layer(s) (738) and the substrate (740) of the second photosensitive assembly (730) can be removed prior or subsequent to coupling of the second photosensitive element assembly (730) to the first photosensitive element assembly (700).

Alternatively, in some embodiments, the first photosensitive element assembly (700) and the second photosensitive element assembly (730) are coupled prior to being coupled to the read-out integrated circuit (704).

In some embodiments of methods of producing photodetectors of the present invention, the second photosensitive element can be etched to provide a desired thickness or to provide one or more apertures in the photosensitive element. In some embodiments, a resist is deposited on the second photosensitive element prior to etching. A resist, in some embodiments, is patterned to provide the second photosensitive element with a pattern of apertures or a pattern of areas having reduced thickness. Etching the second photosensitive element, in some embodiments is administered subsequent to coupling the second photosensitive element to the read-out integrated circuit through one or more accessways passing through the first photosensitive element. In other embodiments, etching of the second photosensitive element is administered prior to coupling the second photosensitive element to the read-out integrated circuit through one or more accessways passing through the first photosensitive element.

As provided herein, in some embodiments, the second photosensitive element of a photodetector of the present invention comprises at least one accessway extending through the element and an electrical connection at least partially disposed in the accessway for receiving a third photosensitive element. The electrical connection of the second photosensitive element, in some embodiments, facilitates electrical communication of a third photosensitive element with the read-out integrated circuit, the third photosensitive element being deposited, constructed or hybridized over the second photosensitive element in a stacked configuration. In some embodiments, the second photosensitive element comprises a plurality of accessways, each accessway having an electrical connection at least partially disposed therein and accessible for receiving a third photosensitive element.

Figure 10A:
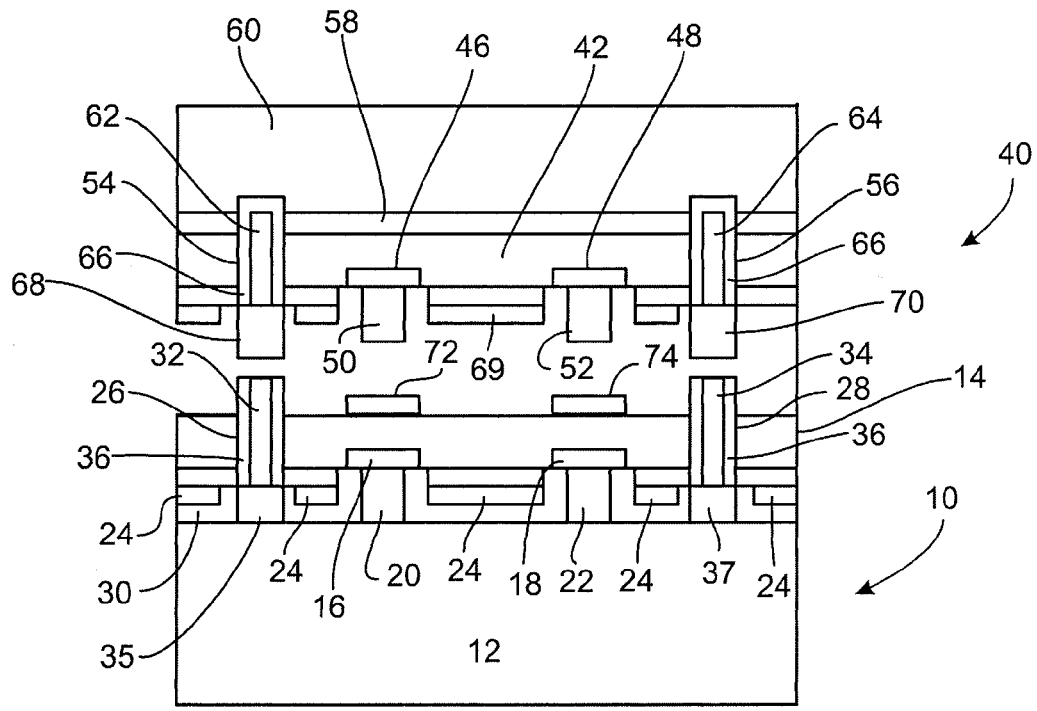
FIGS. 10(a)-(c) illustrate a method of producing a photodetector according to one embodiment of the present invention.
Figure 10B:
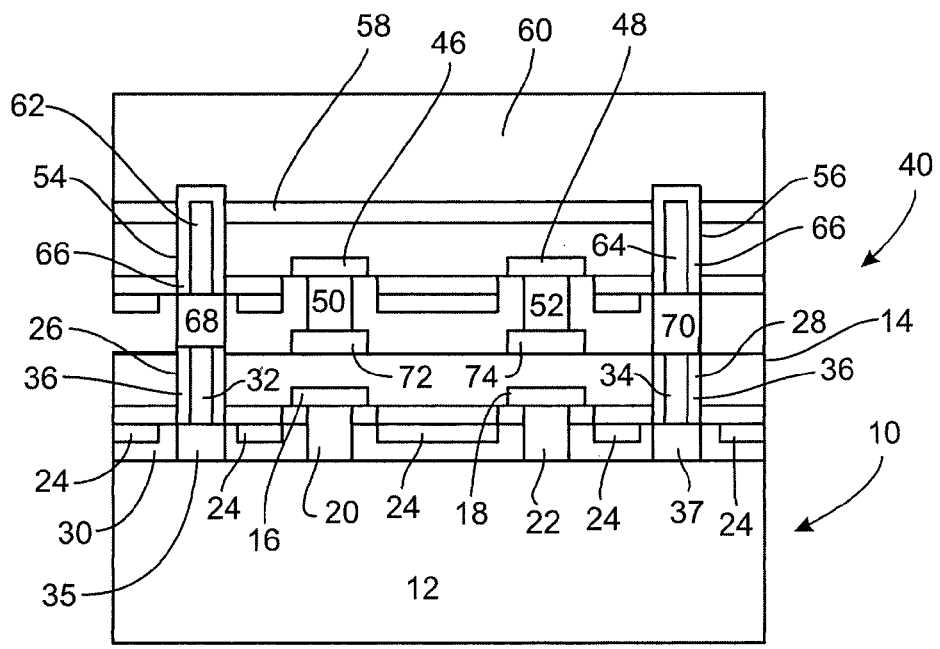
Figure 10C:
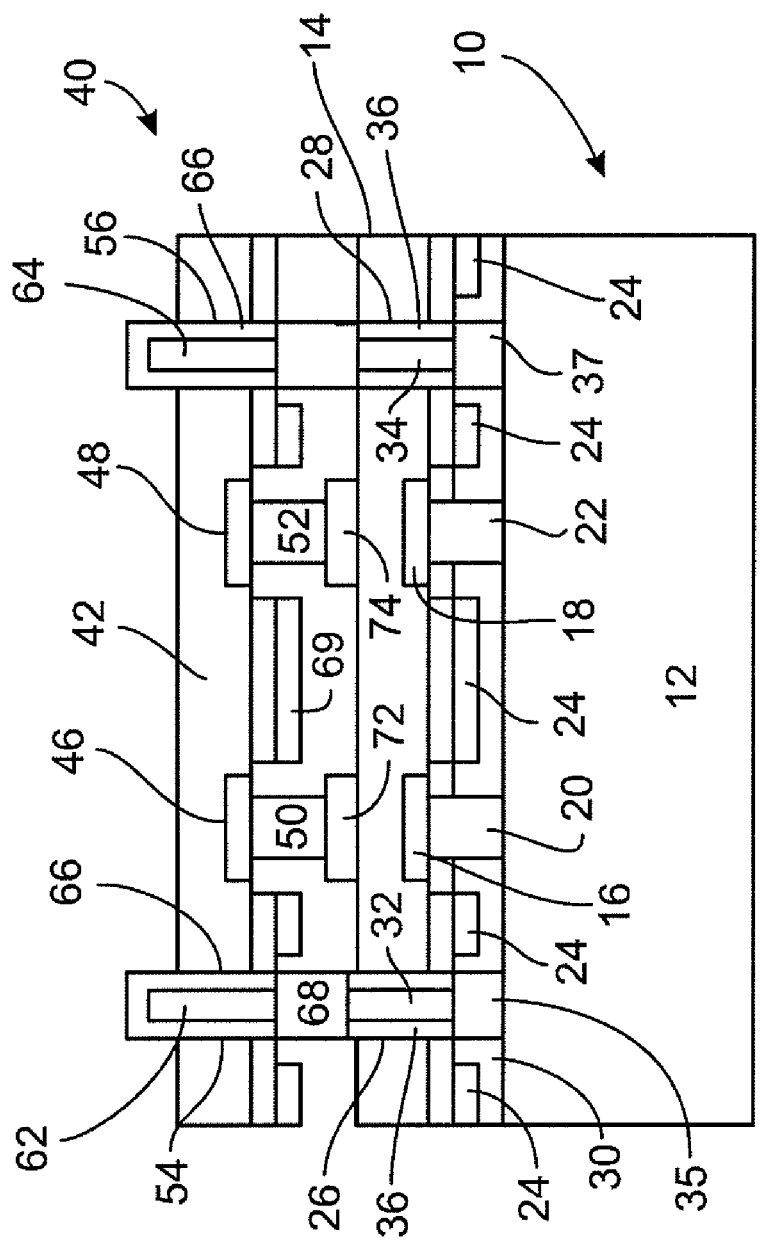

FIGS. 10(a)-(c) illustrate a method of producing a photodetector of the present invention wherein the second photosensitive element comprises a plurality of accessways, each accessway having an electrical connection at least partially disposed therein and accessible for receiving a third photosensitive element.

FIG. 10(a) depicts a cross-sectional view of a first photosensitive element assembly (10) and a second photosensitive element assembly (40). The first photosensitive assembly (10) coupled to a read-out integrated circuit (12). The first photosensitive element assembly (10) comprises a photosensitive element (14). The photosensitive element (14) comprises a plurality of photodiode pixels (16, 18) comprised of pn junctions or p-i-n junctions. In the embodiment illustrated in FIG. 10, p-contacts (20, 22) electrically connect the p-regions of the pixel photodiodes (16, 18) to the read-out integrated circuit. The n-contacts (not shown) for the n-regions of the pixel photodiodes, in some embodiments, can be disposed between the pixel photodiodes (16, 18) or at the periphery of the photodetector.

One or a plurality of insulating materials (24) are also provided in the first photosensitive element assembly (10) to prevent shorting of electrical connections during integration of the assembly (10) with the read-out integrated circuit (12).

The first photosensitive element assembly (10) further comprises accessways (26, 28) extending to the read-out integrated circuit (12) through the first photosensitive element (14) and the underfill material (30). Electrical connections (32, 34) operable to receive and place a second photosensitive element (42) in electrical communication with the read-out integrated circuit (12) are disposed in the accessways (26, 28). Electrical connections (32, 34) terminate in electrical contacts (35, 37) coupled to the read-out integrated circuit (12). An insulating material (36) isolates the electrical connections (32, 34) from the first photosensitive element (12). The electrical connections (32, 34) and the associated insulating material (36) extend above the surface of the first photosensitive element (14).

The second photosensitive element assembly (40) comprises a second photosensitive element (42). The second photosensitive element (42) comprises a plurality of photodiode pixels (46, 48) comprised of pn junctions or p-i-n junctions. In the embodiment illustrated in FIG. 10, p-contacts (50, 52) electrically connect the p-regions of the pixel photodiodes (46, 48) to the read-out integrated circuit through electrical contacts (72, 74) disposed on the surface of the first photosensitive element (14). In some embodiments, electrical contacts (72, 74) are in communication with electrical connections (not shown) extending through the first photosensitive element (12) to the read-out integrated circuit (12).

The second photosensitive element assembly (40) also comprises accessways (54, 56) extending through the second photosensitive element (42) and etch stop or release layer (58) and into the substrate (60) of the second photosensitive element assembly (40). Electrical connections (62, 64) are disposed in the accessways (54, 56). Electrical connections (62, 64) are isolated from the second photosensitive element by an insulating material (66). Moreover, electrical connections (60, 62) terminate in electrical contacts (68, 70).

One or a plurality of insulating materials (69) are also provided in the second photosensitive element assembly (40) to prevent shorting of electrical connections during integration of the assembly (40) with the first photosensitive element assembly (10) and the read-out integrated circuit (12)

As illustrated in FIG. 10(b), electrical contacts (68, 70) of the second photosensitive element assembly (40) are coupled to electrical connections (32, 34) of the first photosensitive element assembly (10). In the embodiment illustrated in FIG. 10(b), electrical connections (62, 64) and electrical contacts (62, 64) of the second photosensitive element assembly (40) are aligned with electrical connections (32, 34) of the first photosensitive element assembly (10). Once coupled, the etch stop or release layer (58) and substrate (60) of the second photosensitive element assembly (40) are removed thereby making electrical connections (62, 64) accessible for receiving a third photosensitive element, as illustrated in FIG. 10(c).

Figure 11A:
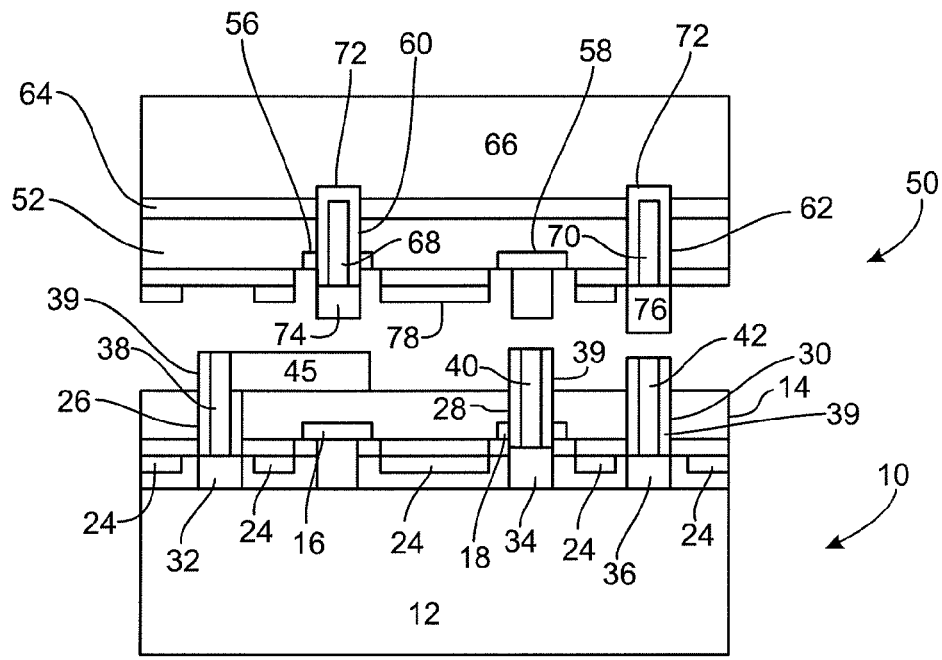
FIGS. 11(a)-(c) illustrate a method of producing a photodetector according to one embodiment of the present invention.
Figure 11B:
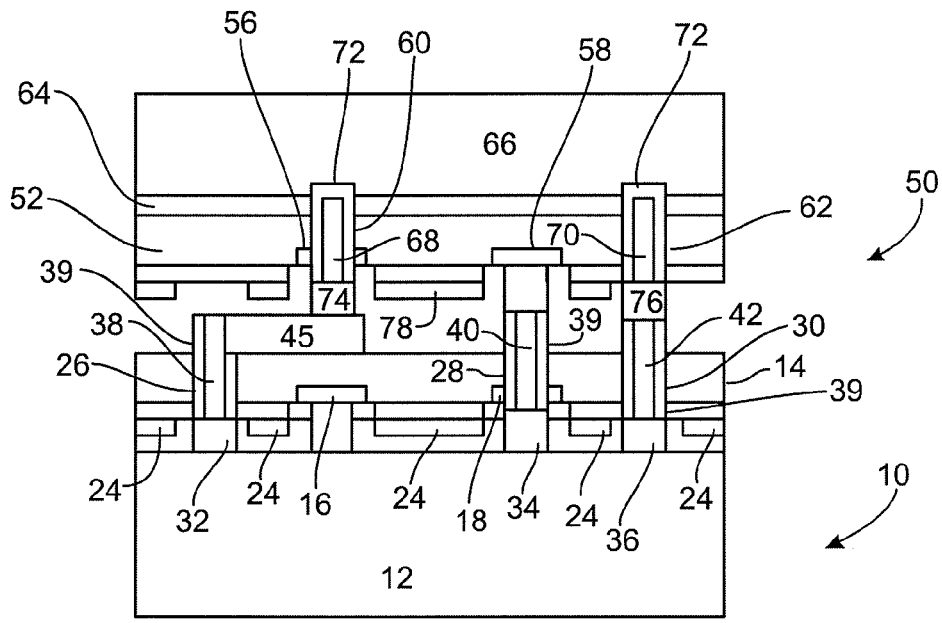
Figure 11C:
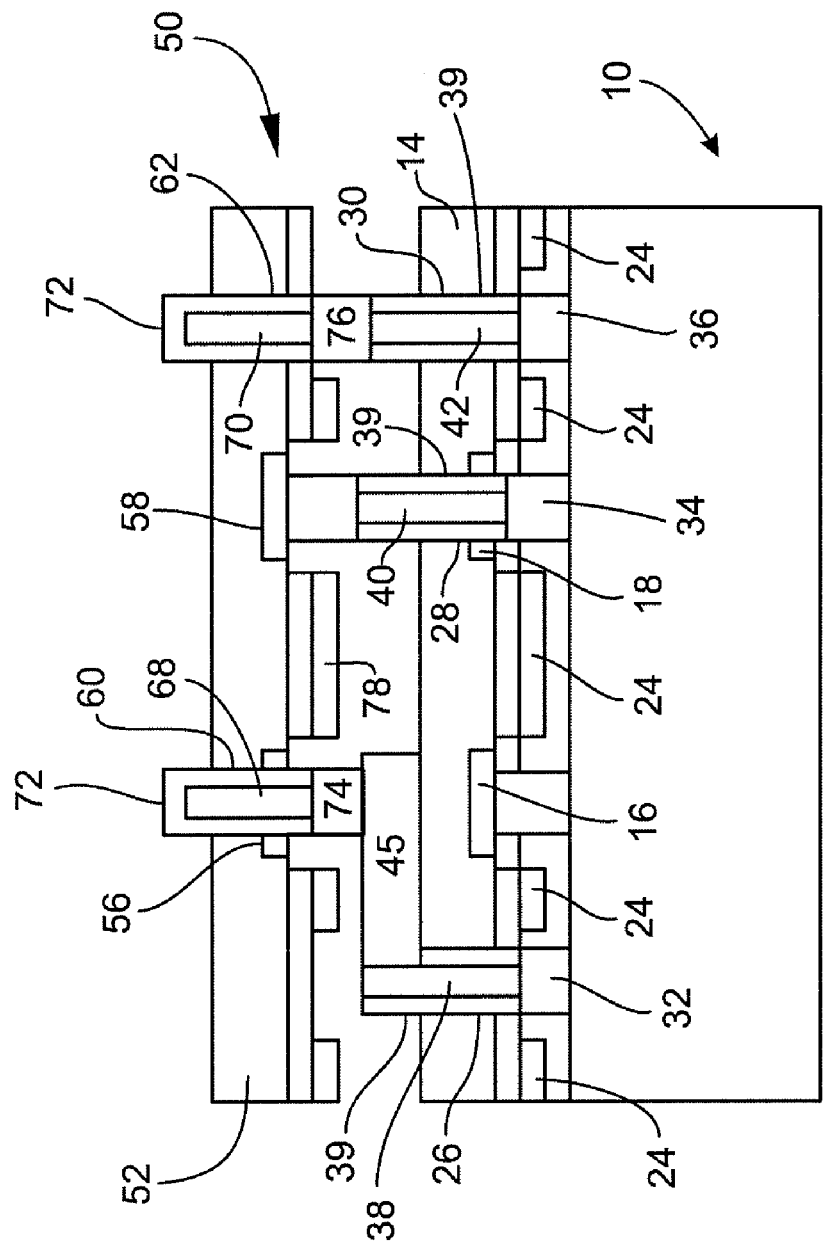

FIGS. 11(a)-(c) illustrate a method of producing a photodetector of the present invention wherein the second photosensitive element comprises a plurality of accessways, each accessway having an electrical connection at least partially disposed therein and accessible for receiving a third photosensitive element.

FIG. 11(a) depicts a cross-sectional view of a first photosensitive element assembly (10) and a second photosensitive element assembly (50). The first photosensitive assembly (10) coupled to a read-out integrated circuit (12). The first photosensitive element assembly (10) comprises a photosensitive element (14). The photosensitive element (14) comprises a plurality of photodiode pixels (16, 18) comprised of pn junctions or p-i-n junctions coupled to the read-out integrated circuit in a manner consistent with that described herein.

One or a plurality of insulating materials (24) are also provided in the first photosensitive element assembly (10) to prevent shorting of electrical connections during integration of the assembly (10) with the read-out integrated circuit (12).

The first photosensitive element assembly (10) further comprises accessways (26, 28, 30) extending through the first photosensitive element (14) and terminating in contacts (32, 34, 36) respectively. Accessways (26, 28, 30) comprise electrical connections (38, 40, 42) at least partially disposed therein operable to receive and place a second photosensitive element (44) in electrical communication with the read-out integrated circuit (12). An insulating material (39) isolates the electrical connections (38, 40, 42) from the first photosensitive element (12). Moreover, electrical connections (34, 40, 42) terminate in electrical contacts (44, 46, 48) respectively. The electrical connections (38, 40, 42) and the associated insulating material (39) extend above the surface of the first photosensitive element (14). Electrical connection (38) additionally has associated therewith a routing (45). Accessway (28) and associated electrical connection (40) in the embodiment illustrated in FIG. 11, are disposed in front of photodiode pixel (18).

The second photosensitive element assembly (50) comprises a second photosensitive element (44). The second photosensitive element (52) comprises a plurality of photodiode pixels (56, 58) comprised of pn junctions or p-i-n junctions. The second photosensitive element assembly (50) also comprises accessways (60, 62) extending through the second photosensitive element (52) and etch stop or release layer (64) and into the substrate (66) of the second photosensitive element assembly (50). Electrical connections (68, 70) are disposed in the accessways (60, 62). Electrical connections (68, 70) are isolated from the second photosensitive element by an insulating material (72). Moreover, electrical connections (68, 70) terminate in electrical contacts (74, 76). Accessway (60) and electrical connection (68) are disposed in front of photodiode pixel (16) of FIG. 11(a).

One or a plurality of insulating materials (78) are also provided in the second photosensitive element assembly (50) to prevent shorting of electrical connections during integration of the assembly (50) with first photosensitive element assembly (10).

As illustrated in FIG. 11(b), electrical contacts (74, 76) of the second photosensitive element assembly (50) are coupled to electrical connections (38, 42) of the first photosensitive element assembly (10). In the embodiment illustrated in FIG. 11(b), electrical connection (68) and electrical contact (74) of the second photosensitive element assembly (50) are not aligned with electrical connection (38) of the first photosensitive element assembly (10). The routing (45) on the surface of the first photosensitive element (14) electrically connects electrical connection (68) of the second photosensitive element assembly (50) and electrical connection (38) of the first photosensitive element assembly (10). Once coupled, the etch stop or release layer (64) and substrate (66) of the second photosensitive element assembly (50) are removed thereby making electrical connections (68, 70) accessible for receiving a third photosensitive element, as illustrated in FIG. 11(c).

Figure 8A:
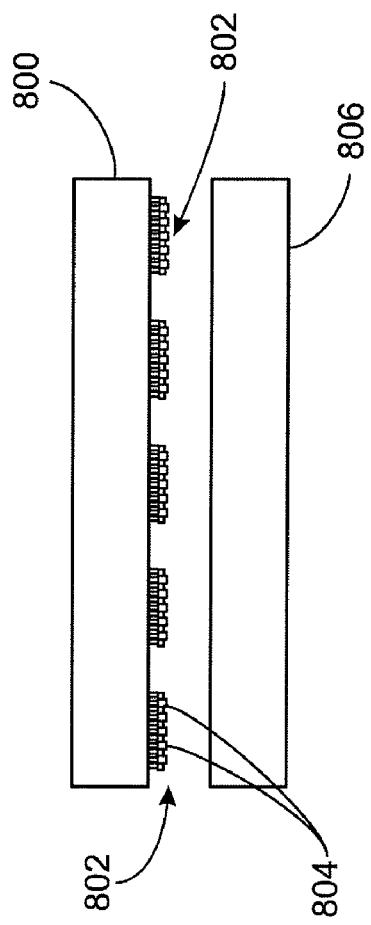
Figure 8B:
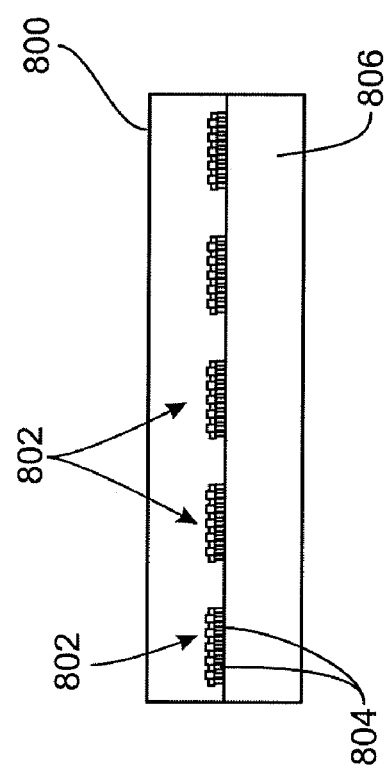

FIGS. 8(a)-(d) illustrate wafer level assembly of photodetectors according to one embodiment of the present invention. As illustrated in FIG. 8(a), a substrate wafer (800) comprising a plurality of arrays (802) of first photosensitive element assemblies (804) is provided. The first photosensitive element assemblies (804) of the arrays (802) can have constructions consistent with any first photosensitive element assembly described herein. The arrays (802) of first photosensitive element assemblies (804) are electrically coupled to a read-out integrated circuit wafer (806) as illustrated in FIG. 8(b). The substrate wafer (800) is subsequently removed from the plurality of arrays (802) thereby exposing electrical connections (808, 810) of each first photosensitive element assembly (804), as provided in FIG. 8(c). The electrical connections (808, 810) extend above the surface of the first photosensitive element (816) of an assembly (804) and are disposed in accessways (812, 814) passing through the first photosensitive element (816) for connection with the read-out integrated circuit wafer (806).

A second photosensitive element (818) is subsequently coupled to the electrical connections (808, 810) of each first photosensitive element assembly (804) to provide arrays (820) of photodetectors (822) on the read-out integrated circuit wafer (806), as illustrated in FIG. 8(d). A second photosensitive element (818), in some embodiments, can be coupled to a first photosensitive element assembly (804) by any method or procedure described herein. In some embodiments, for example, a substrate wafer comprising a plurality of arrays of second photosensitive element assemblies is provided, the plurality of arrays of second photosensitive element assemblies brought into contact and coupled to the arrays of first photosensitive element assemblies as described herein.

Moreover, in the embodiment illustrated in FIG. 8(d), the second photosensitive element (818) of each photodetector is spaced from the first photosensitive element (816) by a distance corresponding to the height an electrical connection (808 or 810) extends above the surface of the first photosensitive element (816) plus any height provided by standoffs and/or electrical contacts on the surface of the second photosensitive element (818).

FIGS. 9(a)-(d) illustrate wafer level assembly of photodetectors according to another embodiment of the present invention. As illustrated in FIG. 9(a), a plurality of substrates (900) are provided, each substrate comprising an array (902) of first photosensitive element assemblies (904). The first photosensitive element assemblies (904) of the arrays (902) can have constructions consistent with any first photosensitive element assembly described herein. The array (902) of first photosensitive element assemblies (904) of each substrate (900) is electrically connected to the read-out integrated circuit wafer (906) as illustrated in FIG. 9(b). Once connected, the substrate (900) of each array (902) of first photosensitive element assemblies (904) is removed, as depicted in FIG. 9(c).

Second photosensitive elements (910) can be provided to each first photosensitive element assembly (904) of each array (902) in any manner described herein for coupling a second photosensitive element to a first photosensitive element assembly. In one embodiment, for example, a plurality of substrates comprising plurality of arrays of second photosensitive element assemblies is provided, the plurality of arrays of second photosensitive element assemblies brought into contact and coupled to the first photosensitive element assemblies as described herein.

FIG. 9(d) illustrates completed arrays (902) of photodetectors (912) coupled to the read-out integrated circuit wafer (906).

In another aspect, the present invention provides methods of detecting a plurality of wavelength ranges of electromagnetic radiation. In one embodiment, a method of detecting a plurality of wavelength ranges comprises providing a photodetector comprising a read-out integrated circuit, a first photosensitive element electrically connected to the read-out integrated circuit and a second photosensitive element electrically connected to the read-out integrated circuit and spaced apart from the first photosensitive element by one or more connections passing through the first photosensitive element and detecting electromagnetic radiation of a first wavelength range with the first photosensitive element and detecting electromagnetic radiation of a second wavelength range with the second photosensitive element.

In another embodiment, a method of detecting a plurality of wavelength ranges comprises providing a photodetector comprising a read-out integrated circuit, a first photosensitive element electrically connected to the read-out integrated circuit and a second photosensitive element electrically connected to the read-out integrated circuit by one or more connections passing through the first photosensitive element and detecting electromagnetic radiation of a first wavelength range with the first photosensitive element and detecting electromagnetic radiation of a second wavelength range with the second photosensitive element, wherein the electromagnetic radiation of the second range has one or more wavelengths longer than the electromagnetic radiation of the first range.

Various non-limiting embodiments of the present invention will now be illustrated in the following, non-limiting example.

Example 1

Photodetector Comprising a First Photosensitive Element Comprising Accessways

A first photosensitive element comprising an $In_{0.53}Ga_{0.47}As$ photosensitive layer epitaxially grown by MOCVD on an InP cathode disposed on an InP substrate was provided. The $In_{0.53}Ga_{0.47}As$ layer had a thickness of about 3.5 µm, the InP cathode had a thickness in the range of about 0.1 to about 2.0 µm, and the InP substrate had a thickness of about 700 μm. An etch stop layer of $In_{0.53}Ga_{0.47}As$ having a thickness of about 0.75 μm was provided between the InP substrate and InP cathode. An InP cap having a thickness in the range of about 0.2 μm to about 1 μm was provided on the surface of the $In_{0.53}Ga_{0.47}As$ layer opposite of the InP substrate.

Two accessways were subsequently chemically etched through the InP cap and $In_{0.53}Ga_{0.47}As$ layer with citric acid/hydrogen peroxide solution. The accessways additionally extended into the InP substrate as each accessway had a depth of about 5 μm measured from the InP cap. A $SiN_x$ insulating material was subsequently deposited in each of the accessways by plasma enhanced chemical vapor deposition (PECVD). $SiN_x$ was additionally deposited on the surface of the InP cap.

Two p-dopant diffusion holes were opened in the $SiN_x$ layer on the InP cap to permit diffusion of a $Zn^+$-dopant into the first photosensitive element for the formation of two p-regions thereby producing two p-i-n photodiode constructions. The p-dopant holes had a diameter within the range of 0.5 μm to 1.2 μm. Gold, nickel or aluminum contacts were then deposited by thermal evaporation, electrical evaporation or a plating process to close the p-dopant holes.

N-contact holes were subsequently opened in the $SiN_x$ layer and paths were chemically etched to the InP cathode followed deposition of gold, gold-germanium or nickel by thermal evaporation, electrical evaporation or a plating process to form the n-contacts.

Nickel was subsequently filled into the open end of the two accessways by thermal evaporation, and the accessways were subsequently capped with gold contacts. Filling the accessways with Ni formed the electrical contacts at least partially disposed in the accessways of the first photosensitive layer as described herein. Indium bumps were formed on the p-region contacts, n-region contacts and accessway contacts for coupling with a read-out integrated circuit. The first photosensitive element was then coupled to a read out integrated circuit by soldering the In bumps to the proper areas on the read-out integrated circuit.

After coupling to the read-out integrated circuit, the InP substrate was removed by a combination of mechanical lapping and wet etching using citric and/or phosphoric acid based etches or RIE processes to reveal electrical connections at least partially disposed in the accessways. As the electrical connections extended into the InP substrate by way of the accessways, removal of the InP substrate permitted extension of the electrical connections above a surface of the first photosensitive element as described herein. Moreover, removal of the InP substrate rendered the electrical connections accessible for receiving a second photosensitive element according to the embodiments described herein.

It is to be understood that the present description illustrates aspects of the invention relevant to a clear understanding of the invention. Certain aspects of the invention that would be apparent to those of ordinary skill in the art and that, therefore, would not facilitate a better understanding of the invention have not been presented in order to simplify the present description. Although the present invention has been described in connection with certain embodiments, the present invention is not limited to the particular embodiments disclosed, but is intended to cover modifications that are within the spirit and scope of the invention, as defined by the appended claims.

The invention claimed is:

1. A photodetector comprising:
a first photosensitive element comprising one or more electrical contacts for coupling to a read-out integrated circuit and at least one accessway extending through the element;
an electrical connection at least partially disposed in the accessway, the electrical connection extending above a surface of the first photosensitive element and accessible for receiving a second photosensitive element; and
a second photosensitive element operable to absorb radiation of a longer wavelength than the first photosensitive element electrically connected to the electrical connection and spaced apart from the first photosensitive element in a stacked configuration.

2. The photodetector of claim 1, wherein the accessible electrical connection couples the received second photosensitive element to the read-out integrated circuit.

3. The photodetector of claim 1, wherein the first photosensitive element comprises $In_xGa_{1-x}As$.

4. The photodetector of claim 3, wherein the $In_xGa_{1-x}As$ comprises $In_{0.53}Ga_{0.47}As$.

5. The photodetector of claim 1, wherein the first photosensitive element comprises an array of pixels.

6. The photodetector of claim 5, wherein the array of pixels comprises a one dimensional array or a two dimensional array.

7. The photodetector of claim 1, wherein the first photosensitive element absorbs visible radiation, short-wavelength infrared radiation, mid-wavelength infrared radiation, long-wavelength infrared radiation or combinations thereof.

8. The photodetector of claim 1, wherein the second photosensitive element is spaced apart from the first photosensitive element by a distance at least partially provided by the electrical connection extending above a surface of the first photosensitive element.

9. The photodetector of claim 1, wherein the second photosensitive element comprises an accessway extending through the element and an electrical connection at least partially disposed in the accessway, the electrical connection accessible for receiving a third photosensitive element.

10. The photodetector of claim 1, wherein the second photosensitive element comprises one more apertures operable to pass radiation to the first photosensitive element.

11. The photodetector of claim 10, wherein the apertures are patterned.

12. The photodetector of claim 10, wherein the second photosensitive element absorbs mid-wavelength infrared radiation or long wavelength infrared radiation.

13. A photodetector comprising:
a read-out integrated circuit;
a first photosensitive element electrically connected to the read-out integrated circuit; and
a second photosensitive element at least partially covering the first photosensitive element and electrically connected to the read-out integrated circuit by one or more connections passing through the first photosensitive element and extending above a surface of the first photosensitive element, wherein the second photosensitive element absorbs electromagnetic radiation of a longer wavelength than the first photosensitive element.

14. A photonic apparatus comprising:
one or more arrays of photodetectors coupled to a read-out integrated circuit wafer, wherein at least one of the photodetectors comprises a first photosensitive element electrically connected to the read-out integrated circuit wafer, the first photosensitive element having an accessway extending through the element and an electrical connection at least partially disposed in the accessway, the electrical connection extending above a surface of the first photosensitive element and accessible for receiving a second photosensitive element, and a second photosensitive element operable to absorb radiation of a longer wavelength than the first photosensitive element electrically connected to the electrical connection and spaced apart from the first photosensitive element in a stacked configuration.

15. A photonic apparatus comprising:
one or more arrays of photodetectors coupled to a read-out integrated circuit wafer, wherein at least one of the photodetectors comprises a first photosensitive element electrically connected to the read-out integrated circuit wafer and a second photosensitive element at least partially covering the first photosensitive element and electrically connected to the read-out circuit wafer by one or more electrical connections passing through the first photosensitive element, the second photosensitive element absorbing electromagnetic radiation of a longer wavelength than the first photosensitive element.

16. A method of producing a photodetector comprising:
providing a first photosensitive element comprising one or more electrical contacts for connecting to a read-out integrated circuit;
providing at least one accessway through the first photosensitive element;
at least partially disposing an electrical connection in the at least one accessway for receiving a second photosensitive element, the electrical connection extending above a surface of the first photosensitive element; and
providing a second photosensitive element and coupling the second photosensitive element to the electrical connection, wherein the second photosensitive element is operable to absorb radiation of a longer wavelength than the first photosensitive element.

17. The method of claim 16 further comprising coupling the first photosensitive element to the read-out integrated circuit.

18. The method of claim 16 further comprising electrically connecting the first photosensitive element to the read-out integrated circuit.

19. A method of producing a photodetector comprising:
providing a read-out integrated circuit;
electrically connecting a first photosensitive element to the read-out integrated circuit; and
electrically connecting a second photosensitive element to the read-out integrated circuit by one or more connections passing through the first photosensitive element and extending above a surface of the first photosensitive element, wherein the second photosensitive element absorbs electromagnetic radiation of a longer wavelength than the first photosensitive element and is spaced apart from the first photosensitive element in a stacked configuration.

20. A method of detecting a plurality of wavelength ranges comprising:
providing a photodetector comprising a read-out integrated circuit, a first photosensitive element electrically connected to the read-out integrated circuit and a second photosensitive element electrically connected to the read-out integrated circuit by one or more connections passing through the first photosensitive element and extending above a surface of the first photosensitive element, the second photosensitive element spaced apart from the first photosensitive element in a stacked configuration; and
detecting electromagnetic radiation of a first wavelength range with the first photosensitive element and detecting electromagnetic radiation of a second wavelength range with the second photosensitive element, wherein the electromagnetic radiation of the second range has one or more wavelengths longer than the electromagnetic radiation of the first range.

21. The method of claim 20, wherein the first wavelength range comprises SWIR and the second wavelength range comprises MWIR, LWIR or combinations thereof.

* * * * *